US 012284890B2

(12) United States Patent
Yu et al.

(10) Patent No.: US 12,284,890 B2
(45) Date of Patent: Apr. 22, 2025

(54) DISPLAY PANEL

(71) Applicants: Chengdu BOE Optoelectronics Technology Co., Ltd., Sichuan (CN); BOE Technology Group Co., Ltd., Beijing (CN)

(72) Inventors: Ziyang Yu, Beijing (CN); Qian Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 524 days.

(21) Appl. No.: 17/764,479

(22) PCT Filed: Jun. 25, 2021

(86) PCT No.: PCT/CN2021/102249
§ 371 (c)(1),
(2) Date: Mar. 28, 2022

(87) PCT Pub. No.: WO2022/266979
PCT Pub. Date: Dec. 29, 2022

(65) Prior Publication Data
US 2023/0263020 A1    Aug. 17, 2023

(51) Int. Cl.
*G09G 3/3208*   (2016.01)
*G09G 3/3233*   (2016.01)
(Continued)

(52) U.S. Cl.
CPC ......... *H10K 59/131* (2023.02); *G09G 3/3233* (2013.01); *H10K 59/124* (2023.02);
(Continued)

(58) Field of Classification Search
CPC .. H10K 59/124; H10K 59/131; H10K 59/875; H10K 59/8791; H10K 59/8793;
(Continued)

(56) References Cited

U.S. PATENT DOCUMENTS

2009/0128018 A1    5/2009  Lee et al.
2014/0070709 A1    3/2014  Lee et al.
(Continued)

FOREIGN PATENT DOCUMENTS

CN    104681589 A    6/2015
CN    105742312 A    7/2016
(Continued)

OTHER PUBLICATIONS

Extended European Search Report in the European Patent Application No. 21946474.0, dated Oct. 4, 2023.
(Continued)

*Primary Examiner* — Chuong A Luu
(74) *Attorney, Agent, or Firm* — Intellectual Valley Law, P.C.

(57) ABSTRACT

A display panel is provided. The display panel includes a plurality of light emitting elements; and an interconnected first voltage supply network configured to provide a first voltage signal to cathodes of the plurality of light emitting elements. The interconnected first voltage supply network includes signal lines in a display area of the display panel, the display area being at least partially surrounded by a peripheral area. The signal lines include a plurality of first signal lines in a fast signal line layer and a plurality of second signal lines in a second signal line layer. The display panel further includes a planarization layer between the first signal line layer and the second signal line layer. The plurality of first signal lines are electrically connected to the plurality of second signal lines.

19 Claims, 41 Drawing Sheets

(51) Int. Cl.
*H10K 59/124* (2023.01)
*H10K 59/131* (2023.01)

(52) U.S. Cl.
CPC .............. *G09G 2300/0426* (2013.01); *G09G 2300/0819* (2013.01); *G09G 2300/0842* (2013.01); *G09G 2300/0861* (2013.01); *G09G 2330/028* (2013.01)

(58) Field of Classification Search
CPC ..... H01L 27/12; H01L 27/124; G09G 3/3208; G09G 3/3233; G09G 3/3291; G09G 2300/0426; G09G 2300/0819; G09G 2300/0842; G09G 2300/0861; G09G 2330/028; H10H 20/00; H10H 20/818; H10H 20/821; H10H 20/0364; H10H 29/00; H10H 29/10; H10H 29/011; H10H 29/14; H10H 29/20; H10H 29/24; H10H 29/37; H10H 29/857; H10H 29/0364
USPC .......................................................... 257/40
See application file for complete search history.

(56) References Cited

U.S. PATENT DOCUMENTS

| | | | |
|---|---|---|---|
| 2015/0144922 A1 | 5/2015 | Moon et al. | |
| 2016/0190228 A1 | 6/2016 | Park | |
| 2019/0252616 A1 | 8/2019 | Kong et al. | |
| 2020/0176541 A1 | 6/2020 | Xu et al. | |
| 2020/0219453 A1* | 7/2020 | Park | H10K 59/131 |
| 2021/0193778 A1 | 6/2021 | Wang et al. | |
| 2021/0234118 A1 | 7/2021 | You et al. | |
| 2021/0367185 A1 | 11/2021 | Xiao | |
| 2021/0376026 A1 | 12/2021 | Mou et al. | |
| 2022/0037615 A1 | 2/2022 | Xu et al. | |
| 2022/0336566 A1 | 10/2022 | Chen et al. | |

FOREIGN PATENT DOCUMENTS

| | | | |
|---|---|---|---|
| CN | 207303105 U | 5/2018 | |
| CN | 108511506 A | 9/2018 | |
| CN | 108628048 A | 10/2018 | |
| CN | 110085768 A | 8/2019 | |
| CN | 110098348 A | 8/2019 | |
| CN | 110112190 A | 8/2019 | |
| CN | 110192282 A | 8/2019 | |
| CN | 209374036 U | 9/2019 | |
| CN | 110739338 A | 1/2020 | |
| CN | 111477669 A | 7/2020 | |
| CN | 211150599 U | 7/2020 | |
| CN | 111509001 A | 8/2020 | |
| CN | 211265478 U | 8/2020 | |
| CN | 211265479 U | 8/2020 | |
| CN | 212517207 U | 2/2021 | |
| KR | 20210068330 A | 6/2021 | |

OTHER PUBLICATIONS

International Search Report & Written Opinion mailed Mar. 23, 2022, regarding PCT/CN2021/102249.
First Office Action in the Chinese Patent Application No. 202180001618.8, dated Jan. 18, 2023; English translation attached.

* cited by examiner

CDL

FIG. 7G

Vss1

DISPLAY PANEL

CROSS-REFERENCE TO RELATED APPLICATION

This application is a national stage application under 35 U.S.C. § 371 of International Application No. PCT/CN2021/102249, filed Jun. 25, 2021, the contents of which are incorporated by reference in the entirety.

TECHNICAL FIELD

The present invention relates to display technology, more particularly, to a display panel.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides a display panel, comprising a plurality of subpixels, a respective subpixel comprising a respective light emitting element and a respective pixel driving circuit; wherein the display panel comprises a plurality of light emitting elements; and an interconnected first voltage supply network configured to provide a first voltage signal to cathodes of the plurality of light emitting elements; wherein the interconnected first voltage supply network comprises signal lines in a display area of the display panel, the display area being at least partially surrounded by a peripheral area; the signal lines comprise a plurality of first signal lines in a first signal line layer and a plurality of second signal lines in a second signal line layer; the display panel further comprises a planarization layer between the first signal line layer and the second signal line layer; and the plurality of first signal lines are electrically connected to the plurality of second signal lines.

Optionally, the interconnected first voltage supply network comprises a plurality of first-first voltage signal lines respectively along a first direction; and a plurality of second-first voltage signal lines respectively along a second direction; wherein the plurality of first-first voltage signal lines respectively cross over the plurality of second-first voltage signal lines.

Optionally, the interconnected first voltage supply network comprises a first sub network formed by the plurality of first-first voltage signal lines and a second sub-network formed by the plurality of second-first voltage signal lines.

Optionally, a respective one of the plurality of first-first voltage signal lines is connected to at least multiple ones of the plurality of second-first voltage signal lines; and a respective one of the plurality of second-first voltage signal lines is connected to at least multiple ones of the plurality of first-first voltage signal lines.

Optionally, the plurality of first-first voltage signal lines and the plurality of second-first voltage signal lines interconnect through first vias respectively extending through the planarization layer, at least some of the first vias being in the display area; a respective one of the plurality of first-first voltage signal lines is connected to at least multiple ones of the plurality of second-first voltage signal lines respectively through multiple first vias extending through the planarization layer; and a respective one of the plurality of second-first voltage signal lines is connected to at least multiple ones of the plurality of first-first voltage signal lines respectively through multiple first gas extending through the planarization layer.

Optionally, the display panel further comprises a gate-on-array circuit in a peripheral area of the display panel; wherein the interconnected first voltage supply network comprises a first peripheral first voltage line in the peripheral area on a first side of the display panel; and an orthographic projection of the first peripheral first voltage line on a base substrate at least partially overlaps with an orthographic projection of the gate-on-array circuit on the base substrate.

Optionally, the display panel further comprises an anode metal layer on a side of the first peripheral first voltage line away from the gate-on-array circuit; and a cathode layer on a side of the anode metal layer away from the first peripheral first voltage line; wherein the cathode layer is connected to the anode metal layer through one or more first peripheral vias in the peripheral area and extending through a third planarization layer, the anode metal layer is connected to the first peripheral first voltage line through one or more second peripheral vias in the peripheral area and extending through a second planarization layer, thereby providing the first voltage signal to the cathodes of the plurality of light emitting elements; the one or more first peripheral vias connecting the cathode layer and the anode metal layer, and the one or more second peripheral vias connecting the anode metal layer and the interconnected first voltage supply network are limited in the peripheral area, and absent in the display area; and the first peripheral first voltage line and the anode metal layer connected to the first peripheral first voltage line respectively partially surround a display area.

Optionally, the display panel further comprises an interconnected reset signal supply network configured to provide a reset signal to a plurality of pixel driving circuits; wherein the interconnected reset signal supply network comprises signal lines in a display area of the display panel.

Optionally, the interconnected reset signal supply network comprises a plurality of first reset signal lines respectively along a first direction; and a plurality of second reset signal lines respectively along a second direction; wherein the plurality of first reset signal lines respectively cross over the plurality of second reset signal lines.

Optionally, a respective one of the plurality of first reset signal lines is connected to at least multiple ones of the plurality of second reset signal lines; and a respective one of the plurality of second reset signal lines is connected to at least multiple ones of the plurality of first reset signal lines.

Optionally, a minimal distance between a respective second reset signal line of the plurality of second reset signal lines and a respective second-first voltage signal line of the plurality of second-first voltage signal lines that is most adjacent to the respective second reset signal line is less than a minimal distance between the respective second reset signal line and a respective data line of a plurality of data line that is most adjacent to the respective second reset signal line.

Optionally, a total of three data lines and a total of one second-first voltage signal line are between two most adjacent second reset signal lines of the plurality of second reset signal lines.

Optionally, the display panel comprises a base substrate; a semiconductor material layer on the base substrate; a planarization layer on a side of the semiconductor material layer away from the base substrate; a second signal line layer on a side of the planarization layer away from the semiconductor material layer; wherein the display panel further comprises an interconnected reset signal supply network configured to provide a reset signal to a plurality of pixel driving circuits; the interconnected reset signal supply network-comprises a plurality of first reset signal lines respectively along a first direction and a plurality of second reset signal lines respectively along a second direction; and the semiconductor material layer comprises the plurality of first reset signal lines, and the second signal line layer comprises the plurality of second reset signal lines.

Optionally, the plurality of first reset signal lines and the plurality of second reset signal lines interconnect through second vias respectively extending through at least the planarization layer; wherein the display panel further comprises a gate insulating layer on a side of the semiconductor material layer away from the base substrate; an insulating layer on a side of the gate insulating layer away from the semiconductor material layer; and an inter-layer dielectric layer a side of the insulating layer away from the gate insulating layer; wherein the planarization layer is on a side of the inter-layer dielectric layer away from the insulating layer; and the plurality of first reset signal lines and the plurality of second reset signal lines interconnect through second vias, a respective second via extending through the planarization layer, the inter-layer dielectric layer, the insulating layer, and the gate insulating layer.

Optionally, a respective one of the plurality of first reset signal lines is connected to at least multiple ones of the plurality of second reset signal lines respectively through multiple second vias extending through at least the planarization layer; and a respective one of the plurality of second reset signal lines is connected to at least multiple ones of the plurality of first reset signal lines respectively through multiple second vias extending through at least the planarization layer.

Optionally, the plurality of first reset signal lines comprise a semiconductor material; the plurality of second reset signal lines comprise a metallic material; and the plurality of first reset signal lines and at least active layers of a plurality of thin film transistors are in the semiconductor material layer, and comprise a same semiconductor material.

Optionally, the display panel further comprises an interconnected second voltage supply network configured to provide a second voltage signal to a plurality of pixel driving circuits; wherein the interconnected second voltage supply network comprises a plurality of first-second voltage signal lines respectively along a first direction; and a plurality of second-second voltage signal lines respectively along a second direction; wherein the plurality of first-second voltage signal lines respectively cross over the plurality of second-second voltage signal lines.

Optionally, a respective one of the plurality of first-second voltage signal lines is connected to at least multiple ones of the plurality of second-second voltage signal lines; and a respective one of the plurality of second-second voltage signal lines is connected to at least multiple ones of the plurality of first-second voltage signal lines.

Optionally, the display panel comprises a base substrate; a first signal line layer on the base substrate; a planarization layer on a side of the first signal line layer away from the base substrate; a second signal line layer on a side of the planarization layer away from the first signal line layer; wherein the interconnected second voltage supply network comprises a plurality of first-second voltage signal lines respectively along a first direction and a plurality of second-second voltage signal lines respectively along a second direction; wherein the first signal line layer comprises the plurality of first-second voltage signal lines, and the second signal line layer comprises the plurality of second-second voltage signal lines.

Optionally, the plurality of first-second voltage signal lines and the plurality of second-second voltage signal lines interconnect through third vias respectively extending through the planarization layer; a respective one of the plurality of first-second voltage signal lines is connected to at least multiple ones of the plurality of second-second voltage signal lines respectively through multiple third vias extending through the planarization layer, and a respective one of the plurality of second-second voltage signal lines is connected to at least multiple ones of the plurality of first-second voltage signal lines respectively through multiple third vias extending through the planarization layer.

Optionally, a respective one of a plurality of first-second voltage signal lines comprises a main body extending along a first direction; a first protrusion protruding away from the main body along a second direction, and a second protrusion protruding away from the first protrusion along the second direction; wherein the second protrusion connects to the main body through the first protrusion; the first protrusion is a portion of the respective one of the plurality of first-second voltage signal lines where the respective one of a plurality of first-second voltage signal lines connects to a second capacitor electrode, and the second protrusion is a portion of the respective one of the plurality of first-second voltage signal lines where the respective one of the plurality of first-second voltage signal lines connects to a source electrode of a fourth transistor of a respective pixel driving circuit, a drain electrode of the fourth transistor being connected to a source electrode of a driving transistor.

Optionally, the display panel further comprises a plurality of second-second voltage signal lines at least partially in the display area; and a peripheral second voltage signal line in the peripheral area on a second side of the display panel; wherein the interconnected first voltage supply network comprises a plurality of first-first voltage signal lines and a plurality of second-first voltage signal lines at least partially in the display area; and a second peripheral first voltage signal line and a third peripheral first voltage signal line in the peripheral area on the second side of the display panel; wherein one or more of the plurality of second-second voltage signal lines are connected to the peripheral second voltage signal line; one or more of the plurality of second-first voltage signal lines are connected to the second peripheral first voltage signal line; the second peripheral first voltage signal line and the third peripheral first voltage signal line are connected to each other through a plurality of bridges; the plurality of first-first voltage signal lines, the peripheral second voltage signal line, and the plurality of bridges are in a first signal line layer; the plurality of second-second voltage signal lines, the second peripheral first voltage signal line are in a second signal line layer; and the third peripheral first voltage signal line comprise a first sub-layer in the first signal line layer and a second sub-layer in the second signal line layer.

Optionally, the display panel further comprises a plurality of gate lines; wherein a respective gate line of the plurality of gate lines comprises a plurality of metal blocks spaced apart from each other in a first conductive layer, and a metal line along a first direction in the first signal line layer, the signal line along the first direction being connected to the plurality of metal blocks, respectively.

Optionally, the display panel further comprises a plurality of first reset control signal line and a plurality of second reset control signal lines; a respective first reset control signal line and a respective second reset control signal line are respectively configured to reset a gate electrode of a driving transistor and an anode of a respective light emitting element; the respective first reset control signal line comprises a plurality of first metal blocks spaced apart from each other in a first conductive layer, and a first metal line along a first direction in the first signal line layer, the first metal line along the first direction being connected to the plurality of first metal blocks, respectively; and the respective second reset control signal line comprises a plurality of second metal blocks spaced apart from each other in the first conductive layer, and a second metal line along the first direction in the first signal line layer, the second metal line along the first direction being connected to the plurality of second metal blocks, respectively.

Optionally, a respective first-first voltage signal line of a plurality of first-first voltage signal lines comprises a first linear portion, a second linear portion, and a connecting portion connecting the first linear portion and the second linear portion; a virtual extension of the first linear portion crosses over the plurality of first metal blocks of the respective first reset control signal line; and an orthographic projection of the second linear portion on a base substrate is spaced apart from orthographic projections the plurality of first metal blocks on the base substrate.

Optionally, the display panel further comprises a second capacitor electrode of a storage capacitor in a second conductive layer; the second capacitor electrode comprises an extension extending away from an electrode main body of the second capacitor electrode; an orthographic projection of the extension on a base substrate at least partially overlaps with an orthographic projection of an active layer of a third transistor of the respective pixel driving circuit on the base substrate; and a portion of the extension is between a first node of the respective pixel driving circuit and a respective data line, configured to prevent interference from signals passing through the respective data line to the first node, the first node being configured to have a same voltage level as a gate electrode of a driving transistor.

BRIEF DESCRIPTION OF THE FIGURES

The following drawings are merely examples for illustrative purposes according to various disclosed embodiments and are not intended to limit the scope of the present invention.

FIG. 7G is a diagram illustrating the structure of a cathode layer in a first region ZR1 depicted in FIG. 7A.

DETAILED DESCRIPTION

Figure 1:
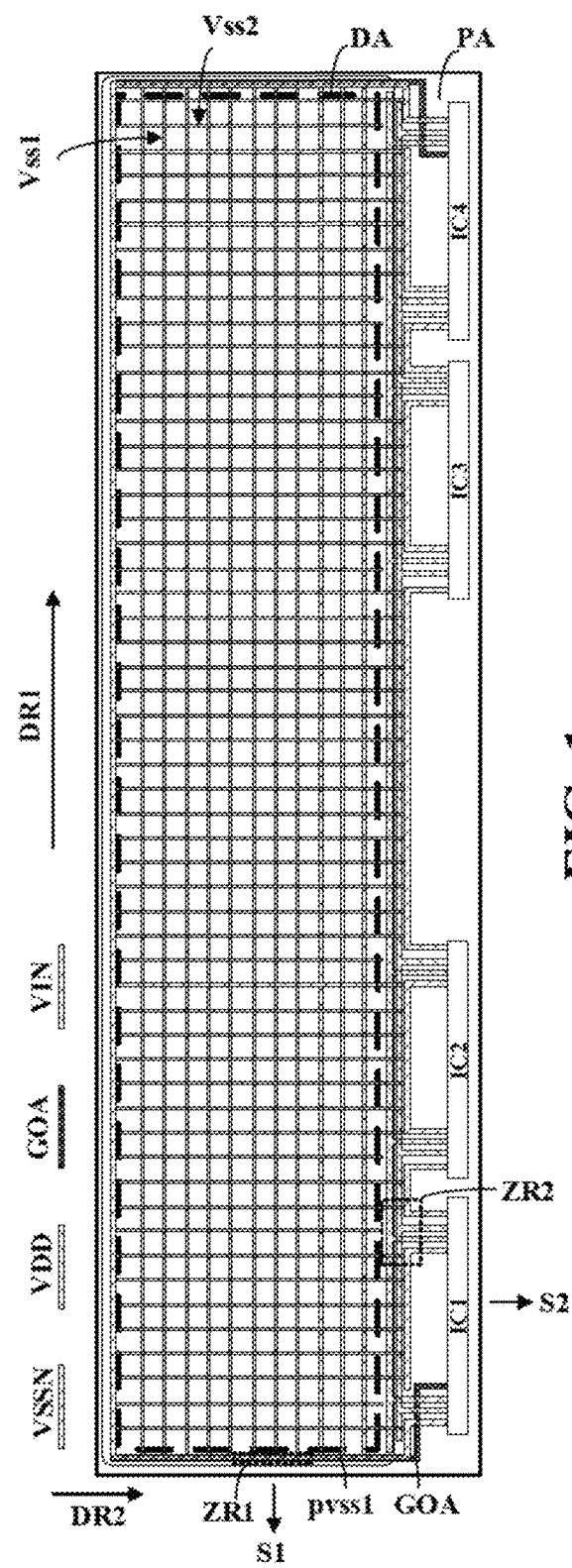
FIG. 1 is a schematic diagram illustrating the structure of a display panel in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, a display panel that substantially obviate one or more of the problems due to limitations and disadvantages of the related art. In one aspect, the present disclosure provides a display panel including a plurality of subpixels. A respective subpixel includes a respective light emitting element and a respective pixel driving circuit. In some embodiments, the display panel includes a plurality of light emitting elements and an interconnected first voltage supply network configured to provide a first voltage signal to cathodes of the plurality of light emitting elements. Optionally, the interconnected first voltage supply network includes signal lines in a display area of the display panel. The display area is at least partially surrounded by a peripheral area. The signal lines include a plurality of first signal lines in a first signal line layer and a plurality of second signal lines in a second signal line layer. The display panel further includes a planarization layer between the first signal line layer and the second signal line layer. The plurality of first signal lines are electrically connected to the plurality of second signal lines. In one example, a first voltage signal line is a low voltage signal line, and a second voltage signal line is a high voltage signal line.

As used herein, the term "display area" refers to an area of the display panel where an image is actually displayed. Optionally, the display area may include both a subpixel region and an inter-subpixel region. A subpixel region refers to a light emission region of a subpixel, such as a region corresponding to a pixel electrode in a liquid crystal display or a region corresponding to a light emissive layer in an organic light emitting display. An inter-subpixel region refers to a region between adjacent subpixel regions, such as a region corresponding to a black matrix in a liquid crystal display or a region corresponding a pixel definition layer in an organic light emitting display. Optionally, the inter-subpixel region is a region between adjacent subpixel regions in a same pixel. Optionally, the inter-subpixel region is a region between two adjacent subpixel regions from two adjacent pixels.

As used herein the term "peripheral area" refers to an area of a display panel where various circuits and wires are provided to transmit signals to the display substrate. To increase the transparency of the display panel, non-transparent or opaque components of the display panel (e.g., battery, printed circuit board, metal frame), can be disposed in the peripheral area rather than in the display areas.

Various appropriate light emitting elements may be used in the present display panel. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

FIG. 1 is a schematic diagram illustrating the structure of a display panel in some embodiments according to the present disclosure. Referring to FIG. 1, the display panel in some embodiments includes an interconnected low voltage supply network VSSN. The interconnected low voltage supply network VSSN is configured to provide a low voltage signal to cathodes of the plurality of light emitting elements. The interconnected low voltage supply network VSSN includes signal lines in a display area DA of the display panel. The display panel further includes one or more integrated circuits (e.g., IC1, IC2, IC3, and IC4) in a peripheral area PA. The display panel further includes one or more high voltage signal line VDD, one or more reset signal line VIN, and a gate-on-array circuit GOA.

In some embodiments, the interconnected low voltage supply network VSSN includes a plurality of first low voltage signal lines Vss1 respectively along a first direction DR1; and a plurality of second low voltage signal lines Vss2 respectively along a second direction DR's. The first direction DR1 and the second direction DR2 are different from each other. The plurality of first low voltage signal lines Vss1 respectively cross over the plurality of second low voltage signal lines Vss2.

Figure 2:
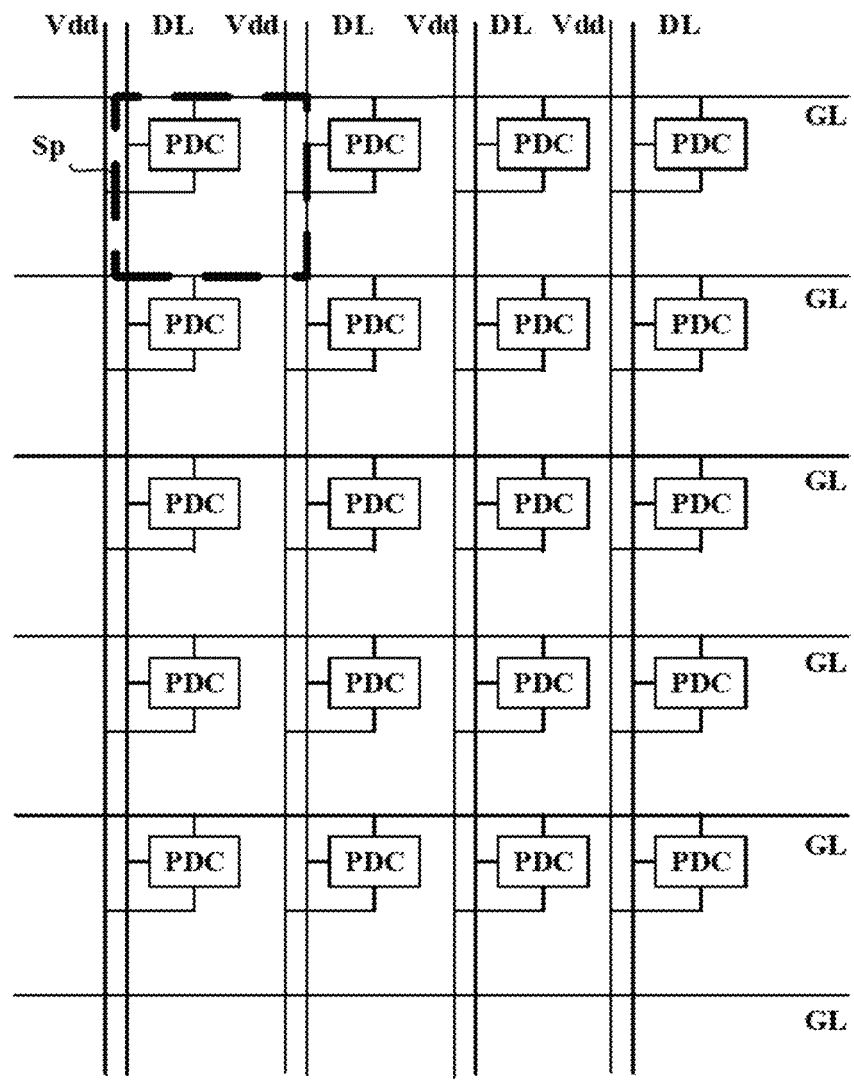
FIG. 2 is a plan-view of a display panel in some embodiments according to the present disclosure.

FIG. 2 is a plan view of a display panel in some embodiments according to the present disclosure. Referring to FIG. 2, the display panel includes an array of subpixels Sp. Each subpixel includes an electronic component. e.g., a light emitting element. In one example, the light emitting element is driven by a respective pixel driving circuit PDC. The display panel includes a plurality of gate lines GL, a plurality of data lines DL, and a plurality of high voltage signal lines Vdd. Light emission in a respective subpixel is driven by a respective pixel driving circuit PDC. In one example, a high voltage signal is input, through a respective one of the plurality of high voltage signal lines Vdd, to the respective pixel driving circuit PDC connected to an anode of the light emitting element; a low voltage signal is input to a cathode of the light emitting element. A voltage difference between the high voltage signal (e.g., the VDD signal) and the low voltage signal (e.g., the VSS signal) is a driving voltage ΔV that drives light emission in the light emitting element.

The display panel in some embodiments includes a plurality of subpixels. In some embodiments, the plurality of subpixels includes a respective first subpixel, a respective second subpixel, a respective third subpixel, and a respective fourth subpixel. Optionally, a respective pixel of the display panel includes the respective first subpixel, the respective second subpixel, the respective third subpixel, and the respective fourth subpixel. The plurality of subpixels in the display panel are arranged in an array. In one example, the array of the plurality of subpixels includes a S1-S2-S3-S4 format repeating array, in which S1 stands for the respective first subpixel. S2 stands for the respective second subpixel. S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color. C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel. In some embodiments, a minimum repeating unit of the plurality of subpixels of the display panel includes the respective first subpixel, the respective second subpixel, the respective third subpixel, and the respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the fifth transistor T5, the sixth transistor T6, and the driving transistor Td.

Various appropriate pixel driving circuits may be used in the present display panel. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is an 7T1C driving circuit. Various appropriate light emitting elements may be used in the present display panel. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 3:
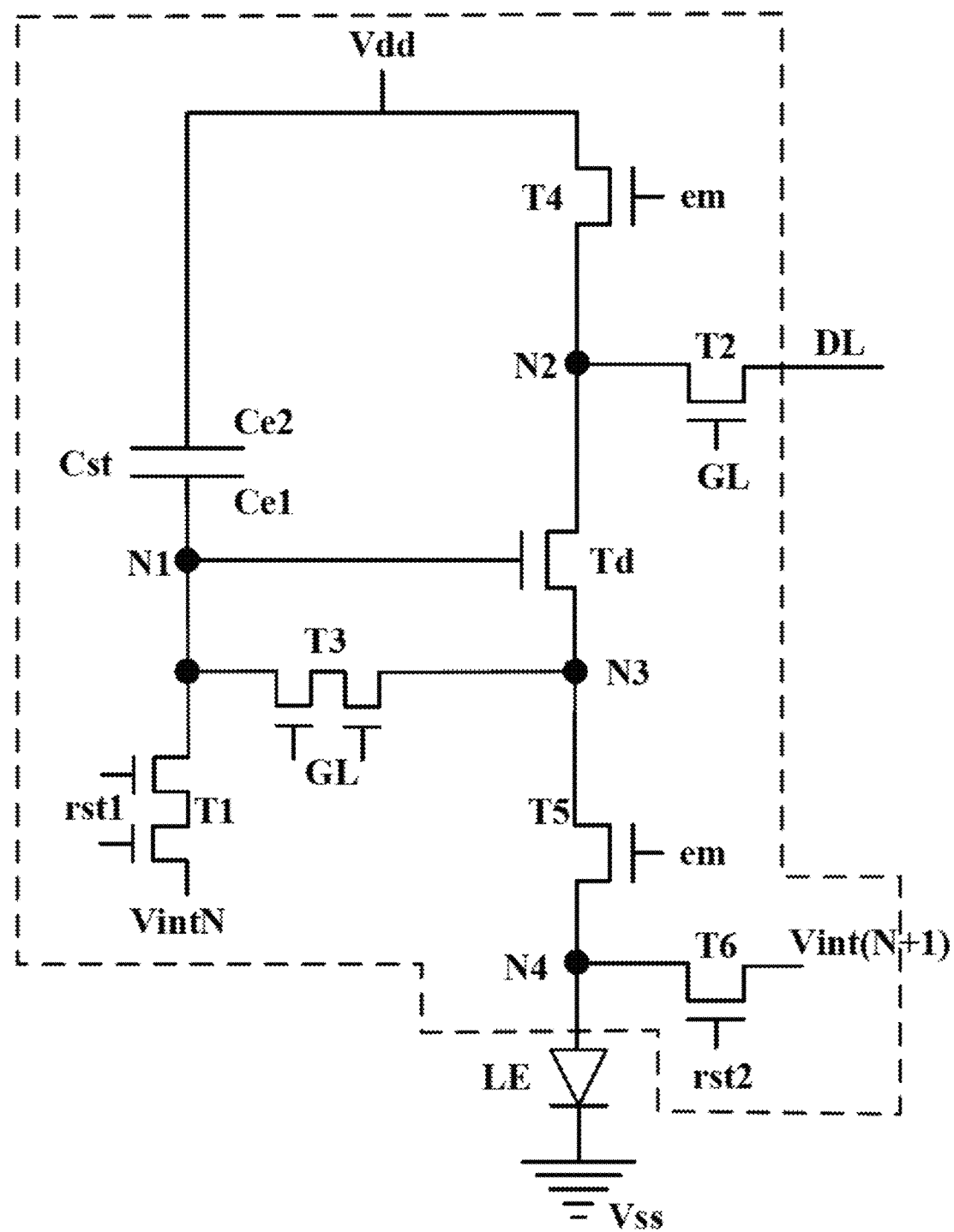
FIG. 3 is a circuit diagram illustrating the structure of a pixel driving circuit in some embodiments according to the present disclosure.

FIG. 3 is a circuit diagram illustrating the structure of a pixel driving circuit in some embodiments according to the present disclosure. Referring to FIG. 3, in some embodiments, the respective pixel driving circuit includes a driving transistor Td; a storage capacitor Cst having a first capacitor electrode Ce1 and a second capacitor electrode Ce2; a first transistor T1 having a gate electrode connected to a respective first reset control signal line of a plurality of first reset control signal line rst1, a source electrode connected to a respective reset signal line VintN in a present stage of a plurality of reset signal line, and a drain electrode connected to a first capacitor electrode Ce1 of the storage capacitor Cst and a gate electrode of the driving transistor Td; a second transistor T2 having a gate electrode connected to a respective gate line of a plurality of gate lines GL, a source electrode connected to a respective data line of a plurality of data lines DL, and a drain electrode connected to a source electrode of the driving transistor Td; a third transistor T3 having a gate electrode connected to the respective gate line, a source electrode connected to the first capacitor electrode Ce1 of the storage capacitor Cst and the gate electrode of the driving transistor Td, and a drain electrode connected to a drain electrode of the driving transistor Td; a fourth transistor T4 having a gate electrode connected to a respective light emitting control signal line of a plurality of light emitting control signal lines em, a source electrode connected to a respective voltage supply line of a plurality of high voltage signal lines Vdd, and a drain electrode connected to the source electrode of the driving transistor Td and the drain electrode of the second transistor T2; a fifth transistor T5 having a gate electrode connected to the respective light emitting control signal line, a source electrode connected to drain electrodes of the driving transistor Td and the third transistor T3, and a drain electrode connected to an anode of a light emitting element LE; and a sixth transistor T6 having a gate electrode connected to a respective second reset control signal line of a plurality of second reset control signal lines rst2, a source electrode connected to a reset signal line Vint(N+1) in the next adjacent stage of the plurality of reset signal line, and a drain electrode connected to the drain electrode of the fifth transistor and the anode of the light emitting element LE. The second capacitor electrode Ce2 is connected to the respective voltage supply line and the source electrode of the fourth transistor T4.

Referring to FIG. 3, in some embodiments, the third transistor T3 is a "double gate" transistor, and the first transistor T1 is a "double gate" transistor. Optionally, in a "double gate" first transistor, the active layer of the first transistor crosses over a respective reset control signal lines twice (alternatively, the respective reset control signal line crosses over the active layer of the first transistor T1 twice). Similarly, in a "double gate" third transistor, the active layer of the third transistor T3 crosses over a respective gate line of the plurality of gate lines GL twice (alternatively, the respective gate line crosses over the active layer of the third transistor T3 twice).

The pixel driving circuit further include a first node N1, a second node N2, a third node N3, and a fourth node N4. The first node N1 is connected to the gate electrode of the driving transistor Td, the first capacitor electrode Ce1, and the source electrode of the third transistor T3. The second node N2 is connected to the drain electrode of the fourth transistor T4, the drain electrode of the second transistor T2, and the source electrode of the driving transistor Td. The third node N3 is connected to the drain electrode of the driving transistor Td, the drain electrode of the third transistor T3, and the source electrode of the fifth transistor T5. The fourth node N4 is connected to the drain electrode of the fifth transistor T5, the drain electrode of the sixth transistor T6, the drain electrode of the sensing transistor Ts, and the anode of the light emitting element LE.

Figure 4A:
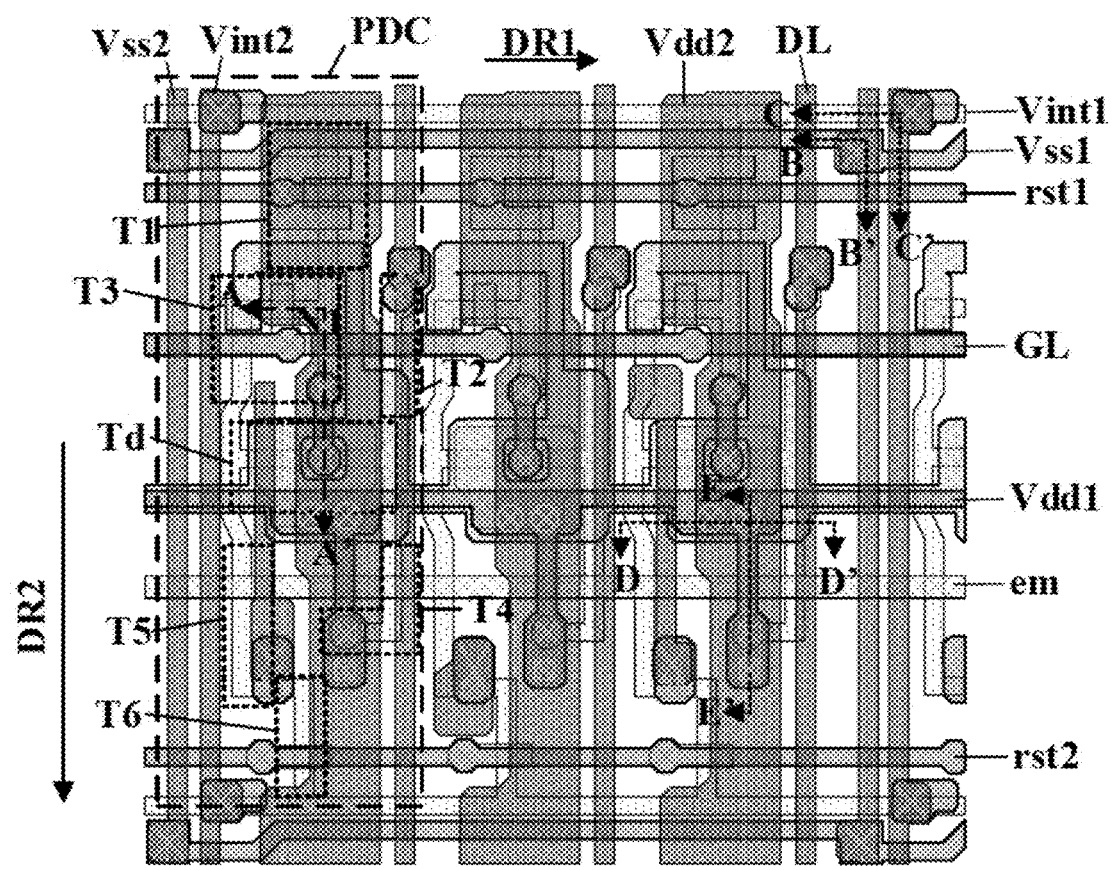
FIG. 4A is a diagram illustrating the structure of three pixel driving circuits for driving light emission of three light emitting elements of a display panel in some embodiments according to the present disclosure.

FIG. 4A is a diagram illustrating the structure of three pixel driving circuits for driving light emission of three light emitting elements of a display panel in some embodiments according to the present disclosure. Referring to FIG. 4A, the display panel in some embodiments includes a plurality of gate lines GL respectively extending along a first direction DR1, a plurality of data lines DL respectively extending along a second direction DR2; a plurality of first high voltage signal lines Vdd1 respectively extending along the first direction DR1; a plurality of second high voltage signal lines Vdd2 respectively extending along the second direction DR2; a plurality of first low voltage signal lines Vss1 respectively extending along the first direction DR1; a plurality of second low voltage signal lines Vss2 respectively extending along the second direction DR2; a plurality of first reset signal lines Vint1 respectively extending along the first direction DR1; and a plurality of second reset signal lines Vint2 respectively extending along the second direction DR2. The plurality of first ow voltage signal lines Vss1 respectively cross over the plurality of second low voltage signal lines Vss2. The plurality of first reset signal lines Vint1 respectively cross over the plurality of second reset signal lines Vint2. The plurality of first high voltage signal lines Vdd1 respectively cross over the plurality of second high voltage signal lines Vdd2. Optionally, the display panel further includes a plurality of first reset control signal lines rail respectively extending along the first direction DR1; a plurality of second reset control signal lines rst2 respectively extending along the first direction DR1; and a plurality of light emitting control signal lines em respectively extending along the first direction DR1. Corresponding positions of the plurality of transistors in a respective pixel driving circuit are PDC depicted in FIG. 4A. The respective pixel driving circuit PDC includes the first transistor T1, the second transistor T2, the third transistor T3, the fourth transistor T4, the fifth transistor T5, the sixth transistor T6, the sensing transistor Ts, and the driving transistor Td.

Figure 4B:
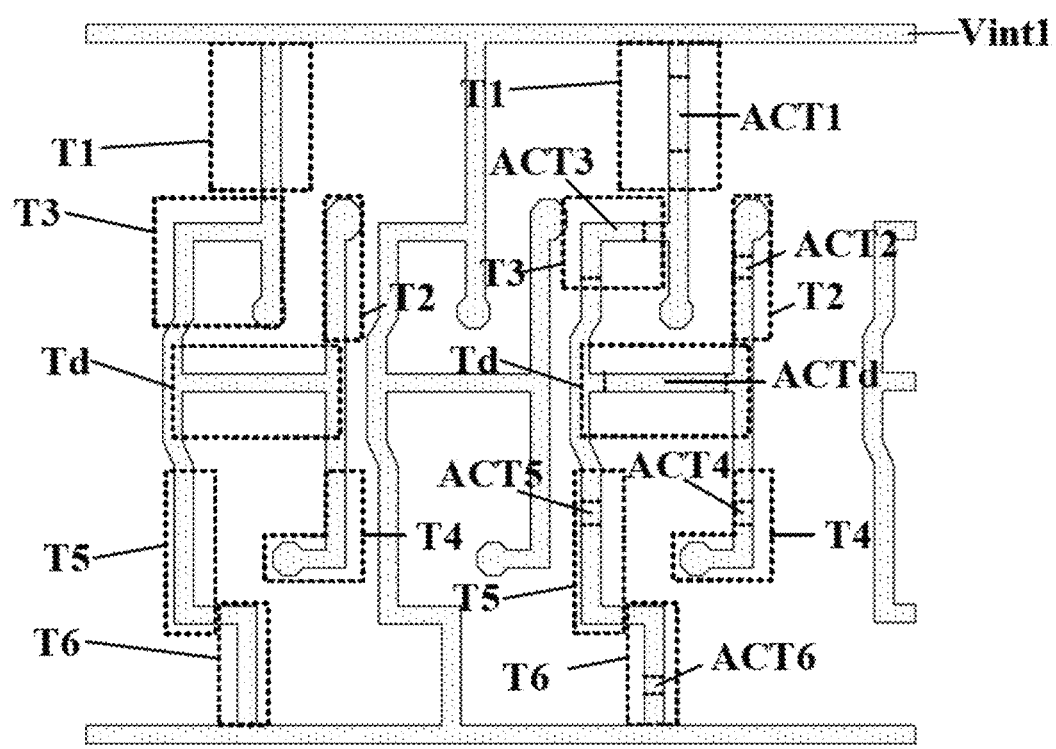
FIG. 4B is a diagram illustrating the structure of a semiconductor material layer in a display panel depicted in FIG. 4A.
Figure 4C:
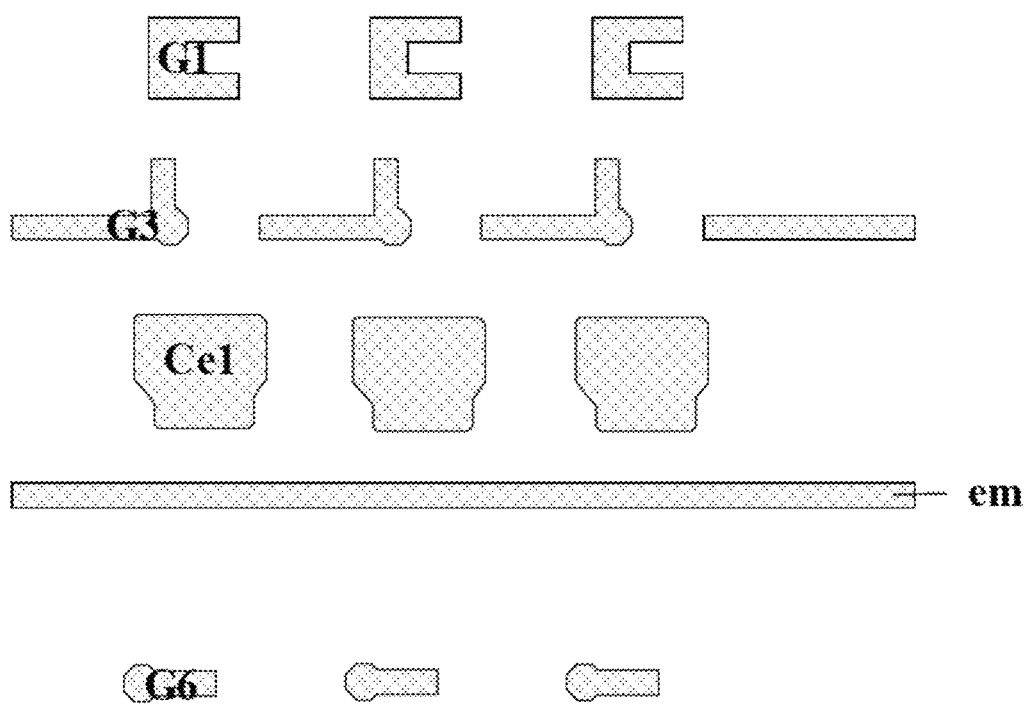
FIG. 4C is a diagram illustrating the structure of a first conductive layer in a display panel depicted in FIG. 4A.
Figure 4D:
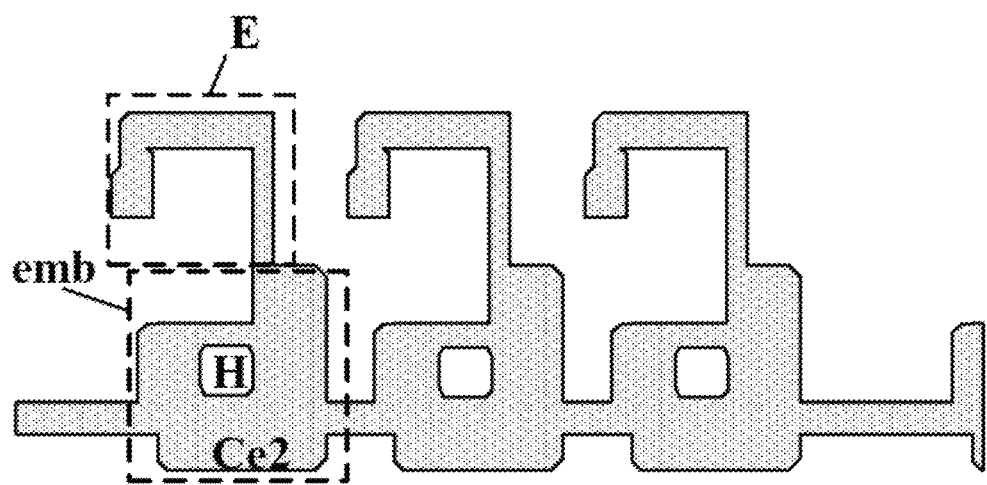
FIG. 4D is a diagram illustrating the structure of a second conductive layer in a display panel depicted in FIG. 4A.
Figure 4E:
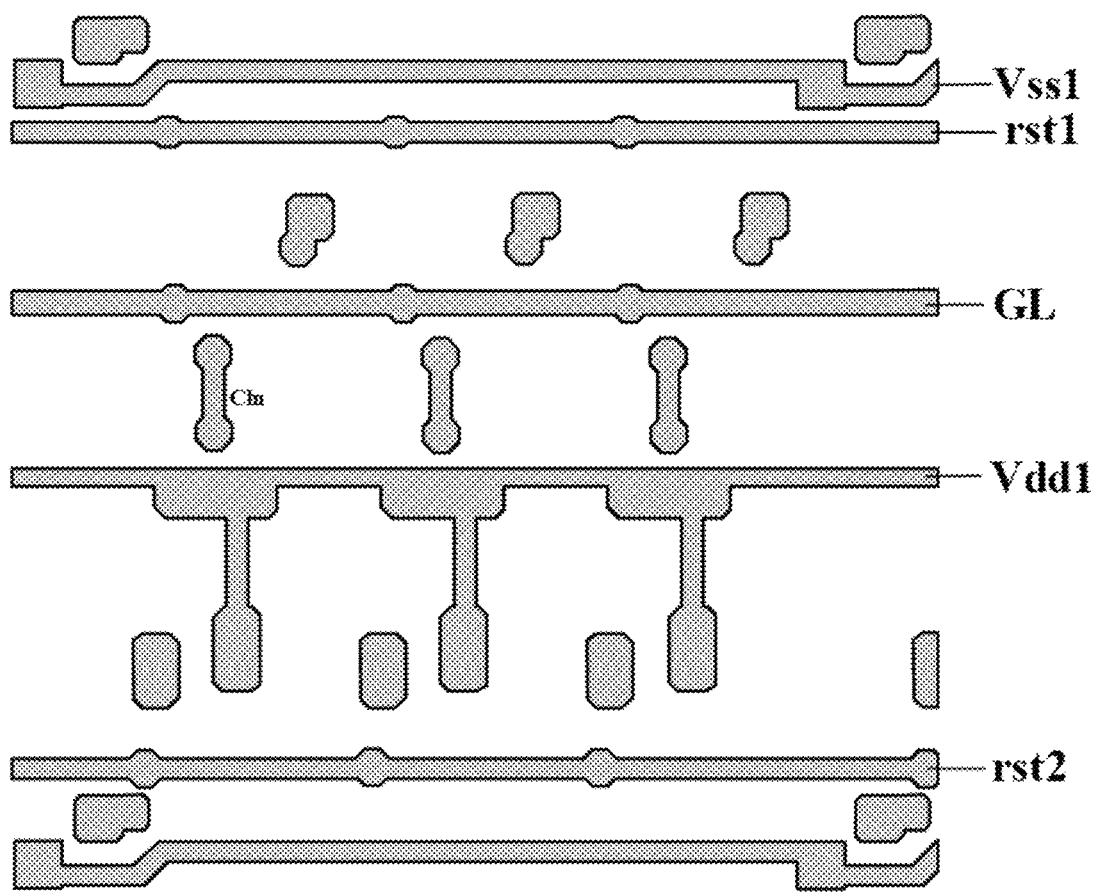
FIG. 4E is a diagram illustrating the structure of a first signal line layer in a display panel depicted in FIG. 4A.

FIG. 4B is a diagram illustrating the structure of a semiconductor material layer in a display panel depicted in FIG. 4A. FIG. 4C is a diagram illustrating the structure of a first conductive layer in a display panel depicted in FIG. 4A. FIG. 4D is a diagram illustrating the structure of a second conductive layer in a display panel depicted in FIG. 4A. FIG. 4E is a diagram illustrating the structure of a first signal line layer in a display panel depicted in FIG. 4A. FIG. 3F is a diagram illustrating the structure of a second signal line layer in a display panel depicted in FIG. 4A. FIG. 5A is a cross-sectional view along an A-A' line in FIG. 4A. Referring to FIG. 4A to FIG. 4F, and FIG. 5A, in some embodiments, the display panel includes a base substrate BS, a semiconductor material layer SML on the base substrate BS, a gate insulating layer G1 on a side of the semiconductor material layer SML away from the base substrate BS, a first conductive layer CT1 on a side of the gate insulating layer G1 away from the semiconductor material layer SML, an insulating layer IN on a side of the first conductive layer CT1 away from the gate insulating layer G1, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a planarization layer PLN on a side of the first signal line layer SL1 away from the inter-layer dielectric layer ILD, and a second signal line layer SL2 on a side of the planarization layer PLN1 away from the first signal line layer SL1.

Referring to FIG. 3, FIG. 4A, and FIG. 4B, in some embodiments, the semiconductor material layer has a unitary structure. In FIG. 4B, the respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, and the driving transistor Td. The respective pixel driving circuit is further annotated with labels indicating components of each of the plurality of transistors in the pixel driving circuit. For example, the first transistor T1 includes an active layer ACT1, a source electrode S1, and a drain electrode D1. The second transistor 12 includes an active layer ACT2, a source electrode S2, and a drain electrode D2. The third transistor T3 includes an active layer ACT5, a source electrode S3, and a drain electrode D3. The fourth transistor T4 includes an active layer ACT4, a source electrode S4, and a drain electrode D4. The fifth transistor T5 includes an active layer ACT5, a source electrode S5, and a drain electrode D5. The sixth transistor T6 includes an active layer ACT6, a source electrode S6, and a drain electrode D6. The driving transistor Td includes an active layer ACTd, a source electrode Sd, and a drain electrode Dd. In one example, the active layers (ACT1. ACT2, ACT5, ACT4, ACT5, ACT6, and ACTd) of the transistors (T1, T2, T3, T4, T5, T6, and Td) in the respective pixel driving circuit are parts of a unitary structure. In another example, the active layers (ACT1, ACT2, ACT5, ACT4, ACT5, ACT6, and ACTd), the source electrodes (S1, S2, S3, S4, S5, S6, and Sd), and the drain electrodes (D1, D2, D3, D4, D5, D6, and Dd) of the transistors (T1, T2, T3, T4, T5, T6, and Td) in the respective pixel driving circuit are parts of a unitary structure. In another example, the active layers (ACT1, ACT2, ACT5, ACT4, ACT5, ACT6, and ACTd) of the transistors (T1, T2, T3, T4, T5, T6, and Td) are in a same layer. In another example, the active layers (ACT1, ACT2, ACT3, ACT4, ACT5, ACT6, and ACTd), the source electrodes (S1, S2, S3, S4, S5, S6, Ss, and Sd), and the drain electrodes (D1, D2, D3, D4, D5, D6, and Dd) of the transistors (T1, T2, T3, T4, T5, T6, and Td) are in a same layer.

Referring to FIG. 4B, in some embodiments, the unitary structure of the semiconductor material layer further includes the plurality of first reset signal lines Vint1. The plurality of first reset signal lines Vint1 are in a same layer as at least the active layers (e.g., ACT1. ACT2, ACT5, ACT4, ACT5, ACT6, and ACTd) of one or more the transistors (e.g., T1, T2, T3, T4, T5, T6, and Td).

As used herein, the active layer refers to a component of the transistor comprising at least a portion of the semiconductor material layer whose orthographic projection on the base substrate overlaps with an orthographic projection of a gate electrode on the base substrate. As used herein, a source electrode refers to a component of the transistor connected to one side of the active layer, and a drain electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a source electrode refers to a component of the transistor connected to a side of the first portion distal to the third portion, and a drain electrode refers to a component of the transistor connected to a side of the second portion distal to the third portion.

Referring to FIG. 3, FIG. 4A, and FIG. 4C, the first conductive layer in some embodiments includes a gate electrode G1 of the first transistor T1, a gate electrode G3 of the third transistor T3, a gate electrode (16 of the sixth transistor T6, a plurality of light emitting control signal lines em, and a first capacitor electrode Ce1 of the storage capacitor Cst. Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the gate electrode G1 of the first transistor T1, the gate electrode G3 of the third transistor T3, the gate electrode G6 of the sixth transistor T6, the plurality of light emitting control signal lines em, and the first capacitor electrode Ce1 are in a same layer.

As used herein, the term "same layer" refers to the relationship between the layers simultaneously formed in the same step. In one example, the plurality of light emitting control signal lines em and the first capacitor electrode Ce1 are in a same layer when they are formed as a result of one or more steps of a same patterning process performed in a same layer of material. In another example, the plurality of light emitting control signal lines ems and the first capacitor electrode Ce1 can be formed in a same layer by simultaneously performing the step of forming the plurality of light emitting control signal lines em, and the step of forming the first capacitor electrode Ce1. The term "same layer" does not always mean that the thickness of the layer or the height of the layer in a cross-sectional view is the same.

In some embodiments, a respective gate line of the plurality of gate lines comprises a plurality of metal blocks (e.g., G3 in FIG. 4C) spaced apart from each other in a first conductive layer, and a metal line (e.g., GL in FIG. 4E) along a first direction in the first signal line layer. The signal line along the first direction is connected to the plurality of metal blocks, respectively. The metal line in the first signal line layer can be made with a metallic material having a relatively low resistance, as compared to the metallic material in the first conductive layer. By having this design, the overall resistance of the gate line can be lowered.

Referring to FIG. 3, FIG. 4A, and FIG. 4D, the second conductive layer in some embodiments includes a second capacitor electrode Ce2 of the storage capacitor Cst. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like.

Referring to FIG. 3, FIG. 4A, and FIG. 4E, the first signal line layer in some embodiments includes a plurality of first low voltage signal lines Vss1, a plurality of first reset control signal lines rst1, a plurality of gate lines GL, a plurality of first high voltage signal lines Vdd1, a plurality of second reset control signal lines rst2, and a node connecting line C1n. Referring to FIG. 5A, the node connecting line C1u connects the first capacitor electrode Ce1 and the source electrode S3 of the third transistor 13 in a respective pixel driving circuit together. Various appropriate conductive materials and various appropriate fabricating methods may be used to make the first signal line layer. For example, a conductive material may be deposited on the substrate by a plasma-enhanced chemical vapor deposition (PECVD) process and patterned. Examples of appropriate conductive materials for snaking the first signal line layer include, but are not limited to, aluminum, copper, molybdenums, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first low voltage signal lines Vss1, the plurality of first reset control signal lines rst1, the plurality of gate lines GL, the plurality of first high voltage signal lines Vdd1, the plurality of second reset control signal lines rst2, and the node connecting line C1n are in a same layer.

In some embodiments, the respective first reset control signal line rst1 include a plurality of first metal blocks spaced apart from each other in a first conductive layer, and a first metal line along a first direction in the first signal line layer, the first metal line along the first direction being connected to the plurality of first metal blocks, respectively. In some embodiments, the respective second reset control signal line comprises a plurality of second metal blocks spaced apart from each other in the first conductive layer, and a second metal line along the first direction in the first signal line layer, the second metal line along the first direction being connected to the plurality of second metal blocks, respectively.

In some embodiments, a respective first low voltage signal line of a plurality of first low voltage signal lines Vss1 includes a first linear portion, a second linear portion, and a connecting portion connecting the first linear portion and the second linear portion. A virtual extension of the first linear portion crosses over the plurality of first metal blocks (e.g., G1 in FIG. 4C) of the respective first reset control signal line rst1. A virtual extension of the second linear portion is spaced apart from the plurality of first metal blocks, e.g., does not cross over the plurality of first metal blocks (e.g., G1 in FIG. 4C) of the respective first reset control signal line rst1. An orthographic projection of the second linear portion on a base substrate is spaced apart from orthographic projections of the plurality of first metal blocks. FIG. 4J is a diagram illustrating a relative position between a respective one of a plurality of first low voltage signal lines and a plurality of first metal blocks of a respective first reset control signal line in some embodiments according to the present disclosure. Referring to FIG. 4J, a respective first low voltage signal line of a plurality of first low voltage signal lines Vss1 includes a first linear portion LP1, a second linear portion LP2, and a connecting portion CP connecting the first linear portion LP1 and the second linear portion LP2. A virtual extension VE of the first linear portion LP1 crosses over the plurality of first metal blocks (G1) of the respective first reset control signal line rst1. A virtual extension of the second linear portion LP2 is spaced apart from the plurality of first metal blocks, e.g., does not cross over the plurality of first metal blocks (G1) of the respective first reset control signal line rst1.

Figure 4F:
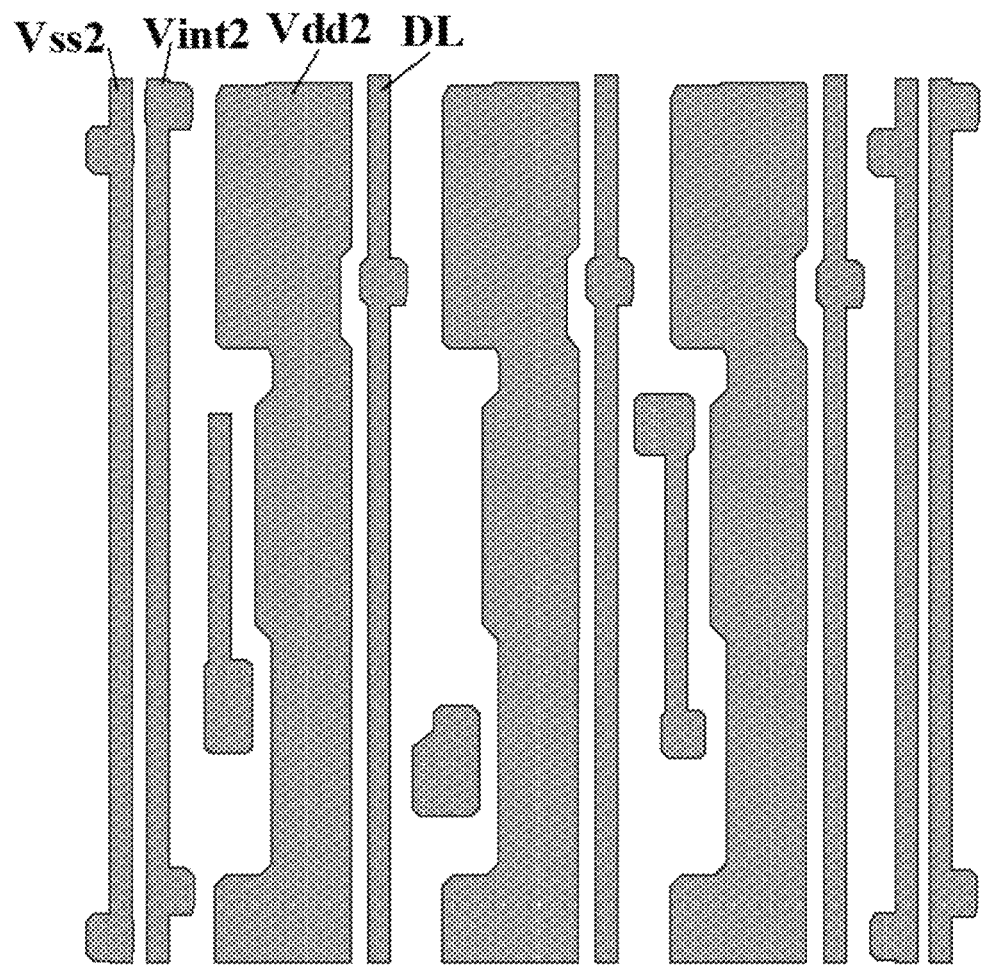
FIG. 4F is a diagram illustrating the structure of a second signal line layer in a display panel depicted in FIG. 4A.
Figure 5A:
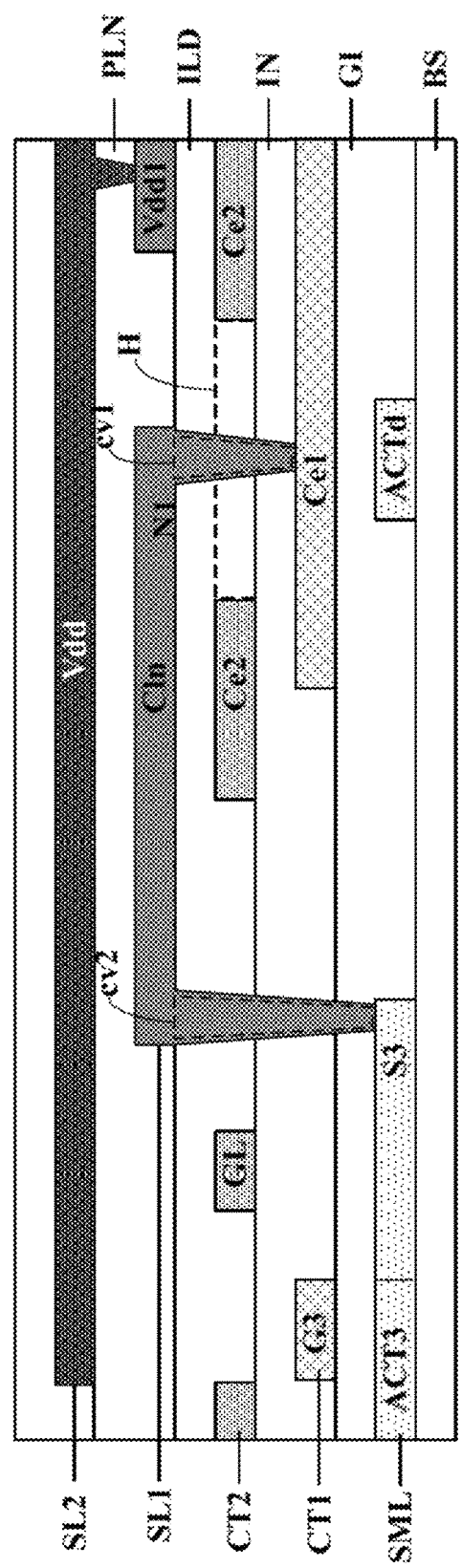
FIG. 5A is a cross-sectional view along an A-A' line in FIG. 4A.

Referring to FIG. 3, FIG. 4A, and FIG. 4F, the second signal line layer in some embodiments includes a plurality of data line DL, a plurality of second low voltage signal lines Vss2, a plurality of second reset signal lines Vint2, and a plurality of second high voltage signal lines Vdd2. Various appropriate conductive materials and various appropriate fabricating methods may be used to make the second signal line layer. For example, a conductive material may be deposited on the substrate by a plasma-enhanced chemical vapor deposition (PECVD) process and patterned Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of data line DL, the plurality of second low voltage signal lines Vss2, the plurality of second reset signal lines Vint2, and the plurality of second high voltage signal lines Vdd2 are in a same layer.

Referring to FIG. 4F, in some embodiments, a minimal distance between a respective second reset signal line of the plurality of second reset signal lines Vint2 and a respective second low voltage signal line of the plurality of second low voltage signal lines Vss2 that is most adjacent to the respective second reset signal line is less than a minimal distance between the respective second reset signal line and a respective data line of a plurality of data line DL that is most adjacent to the respective second reset signal line. In some embodiments, a total of three data lines and a total of one second low voltage signal line are between two most adjacent second reset signal lines of the plurality of second reset signal lines Vint2. Optionally, a total of three data lines, a total of one second low voltage signal line, and a total of three second high voltage signal lines are between two most adjacent second reset signal lines of the plurality of second reset signal lines Vint2.

Referring to FIG. 3, FIG. 4D, FIG. 4E, and FIG. 5A, in some embodiments, an orthographic projection of the second capacitor electrode Ce2 on a base substrate BS completely covers, with a margin, an orthographic projection of the first capacitor electrode Ce1 on the base substrate BS except for a hole region H in which a portion of the second capacitor electrode Ce2 is absent. In some embodiments, the first signal line layer includes a node connecting line C1$n$ on a side of the inter-layer dielectric layer ILD away from the second capacitor electrode Ce2. The node connecting line C1$n$ is in a same layer as the plurality of first low voltage signal lines Vss1, the plurality of first reset control signal lines rst1, the plurality of gate lines GL, the plurality of first high voltage signal lines Vdd1, and the plurality of second reset control signal lines rst2. Optionally, the display panel further includes a first connecting via cv1 in the hole region H and extending through the inter-layer dielectric layer ILD and the insulating layer IN. Optionally, the node connecting line C1$n$ is connected to the first capacitor electrode Ce1 through the first connecting via cv1. In some embodiments, the first capacitor electrode Ce1 is on a side of the gate insulating layer IN away from the base substrate BS. Optionally, the display panel further includes a first connecting via cv1 and a second connecting via cv2. The first connecting via cv1 is in the hole region H and extends through the inter-layer dielectric layer ILD and the insulating layer IN. The second connecting via cv2 extends through the inter-layer dielectric layer ILD, the insulating layer IN, and the gate insulating layer G1. Optionally, the node connecting line C1$u$ is connected to the first capacitor electrode Ce1 through the first connecting via cv1, and is connected node connecting line C1$n$ is connected the semiconductor material layer SML through the second connecting via cv2. Optionally, the node connecting line C1$n$ is connected to the source electrode S3 of third transistor T3, as depicted in FIG. 5A.

In some embodiments, referring to FIG. 4D, the second capacitor electrode Ce2 includes an extension E extending away from an electrode main body emb of the second capacitor electrode Ce2. Referring to FIG. 4A, an orthographic projection of the extension E on a base substrate at least partially overlaps with an orthographic projection of an active layer of a third transistor T3 of the respective pixel driving circuit. A portion of the extension E is between a first node N1 of the respective pixel driving circuit and a respective data line of the plurality of data lines d1, configured to prevent interference from signals passing through the respective data line to the first node N.

Figure 6A:
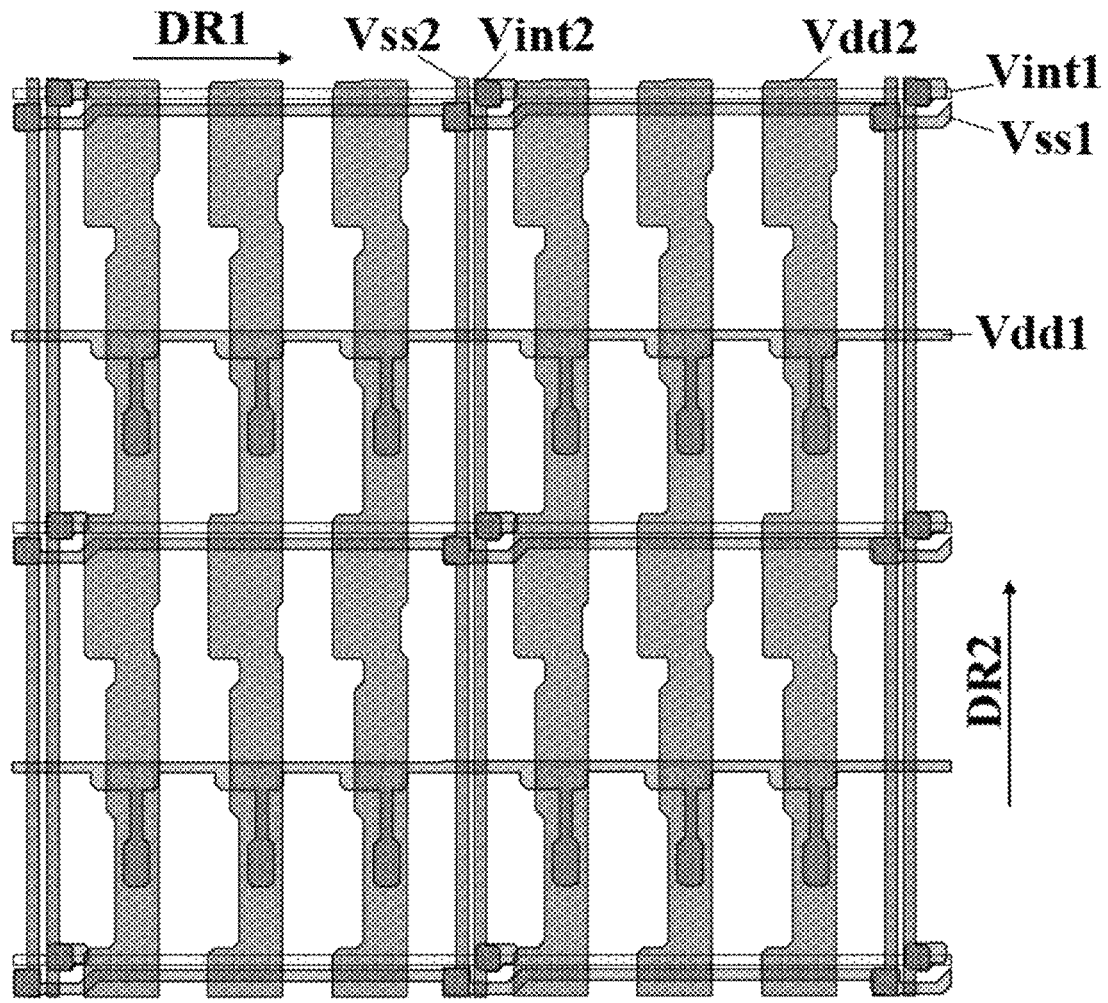
FIG. 6A is a diagram illustrating the structure of an interconnected low voltage supply network, an interconnected reset signal supply network, and an interconnected high voltage supply network in a display panel in some embodiments according to the present disclosure.

FIG. 6A is a diagram illustrating the structure of an interconnected low voltage supply network, an interconnected reset signal supply network, and an interconnected high voltage supply network in a display panel in some embodiments according to the present disclosure. The interconnected low voltage supply network includes signal lines in a display area of the display panel. The interconnected low voltage supply network is configured to provide a low voltage signal to cathodes of the plurality of light emitting elements. The interconnected reset signal supply network is configured to provide a reset signal to a plurality of pixel driving circuits. The interconnected reset signal supply network includes signal lines in a display area of the display panel. The interconnected high voltage supply network is configured to provide a high voltage signal to a plurality of pixel driving circuits. The interconnected high voltage supply network includes signal lines in a display area of the display panel. In one example, a first voltage signal line is a low voltage signal line, and a second voltage signal line is a high voltage signal line.

Figure 6B:
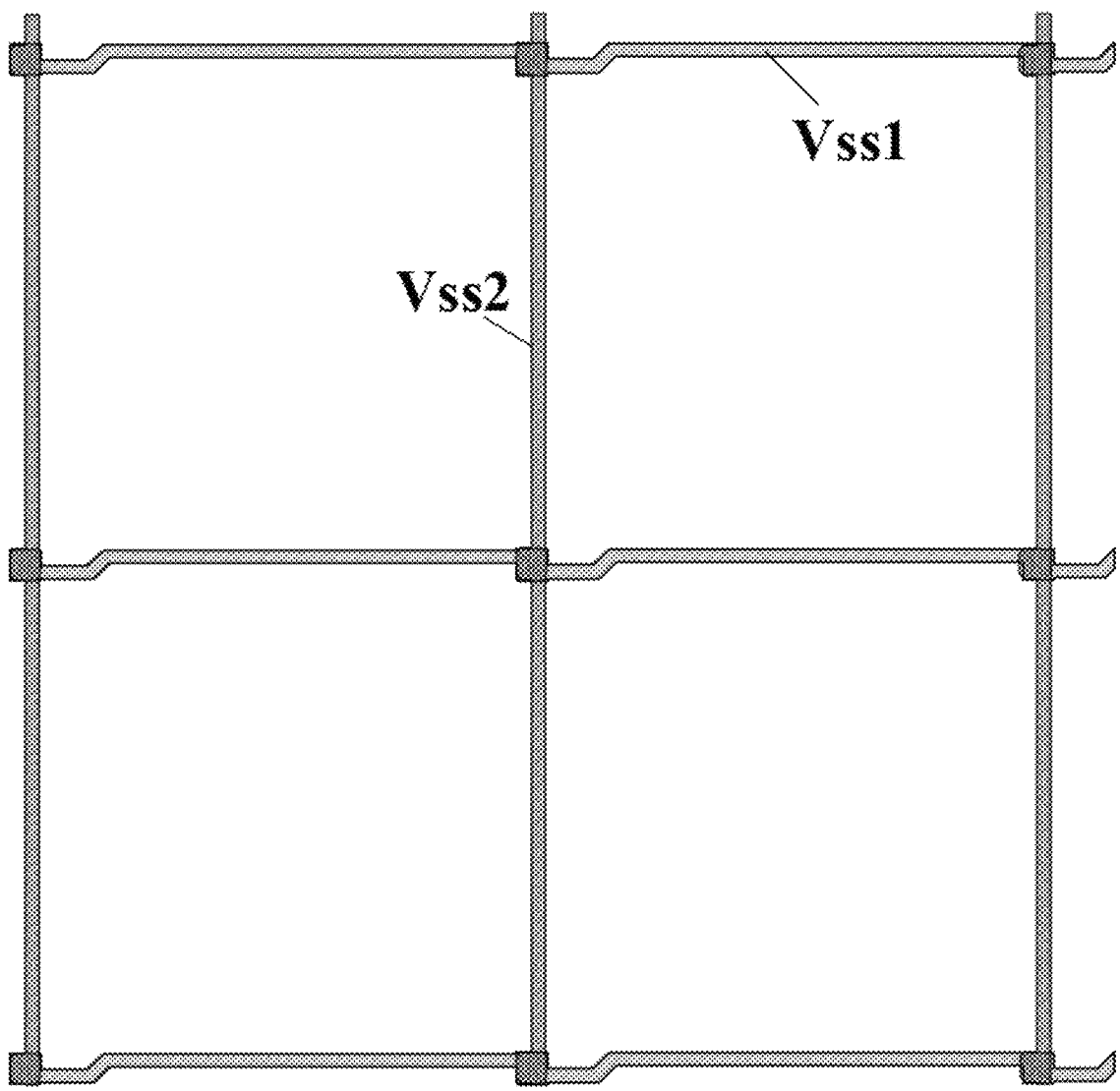
FIG. 6B is a diagram illustrating the structure of an interconnected low voltage supply network in a display panel in some embodiments according to the present disclosure.

FIG. 6B is a diagram illustrating the structure of an interconnected low voltage supply network in a display panel in some embodiments according to the present disclosure. Referring to FIG. 6A and FIG. 6B, the interconnected low voltage supply network in some embodiments includes a plurality of first low voltage signal lines Vss1 respectively along a first direction DR1; and a plurality of second low voltage signal lines Vss2 respectively along a second direction DR2. The plurality of first low voltage signal lines Vss1 respectively cross over the plurality of second low voltage signal lines Vss2. A respective one of the plurality of first low voltage signal lines Vss1 is connected to at least multiple ones of the plurality of second low voltage signal lines Vss2. A respective one of the plurality of second low voltage signal lines Vss2 is connected to at least multiple ones of the plurality of first low voltage signal lines Vss1.

Figure 5B:
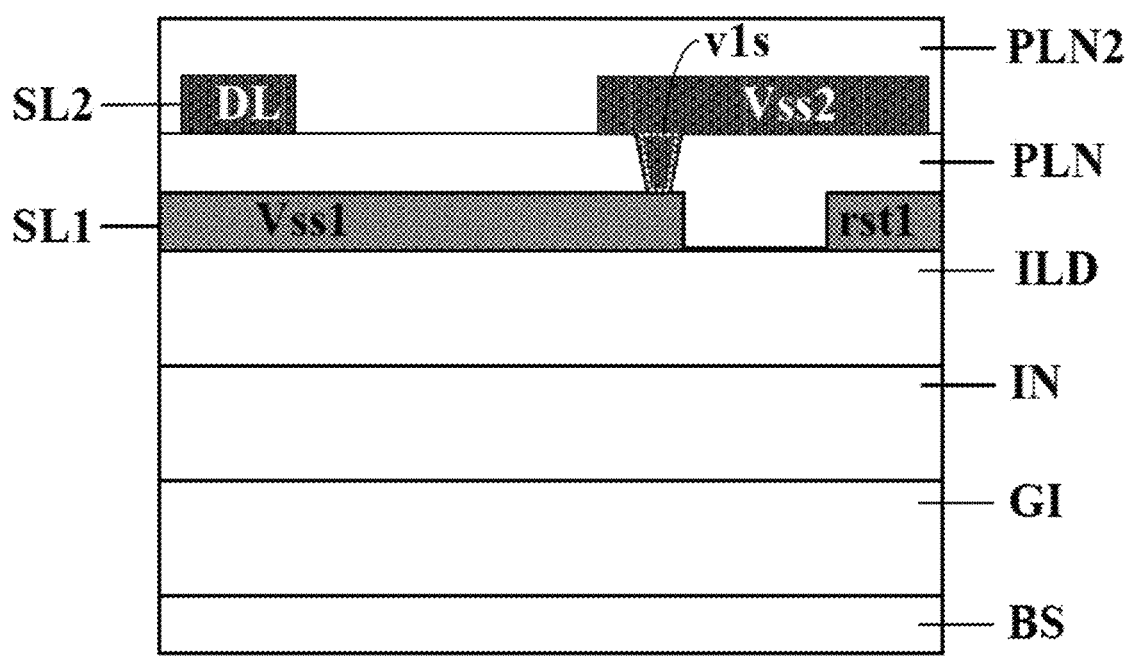
FIG. 5B is a cross-sectional view along a B-B' line in FIG. 4A.

FIG. 5B is a cross-sectional view along a B-B' line in FIG. 4A. Referring to FIG. 5B, FIG. 6A, and FIG. 6B, in some embodiments, the first signal line layer SL1 includes the plurality of first low voltage signal lines Vss1, and the second signal line layer SL2 includes the plurality of second low voltage signal lines Vss2. The plurality of first low voltage signal lines Vss1 and the plurality of second low voltage signal lines Vss2 interconnect through first vias v1s respectively extending through the planarization layer PLN. At least some of the first vias are in the display area. A respective one of the plurality of first low voltage signal lines Vss1 is connected to at least multiple ones of the plurality of second low voltage signal lines Vss2 respectively through multiple first vias extending through the planarization layer PLN. A respective one of the plurality of second low voltage signal lines Vss2 is connected to at least multiple ones of the plurality of first low voltage signal lines Vss1 respectively through multiple first vias extending through the planarization layer PLN.

Figure 6C:
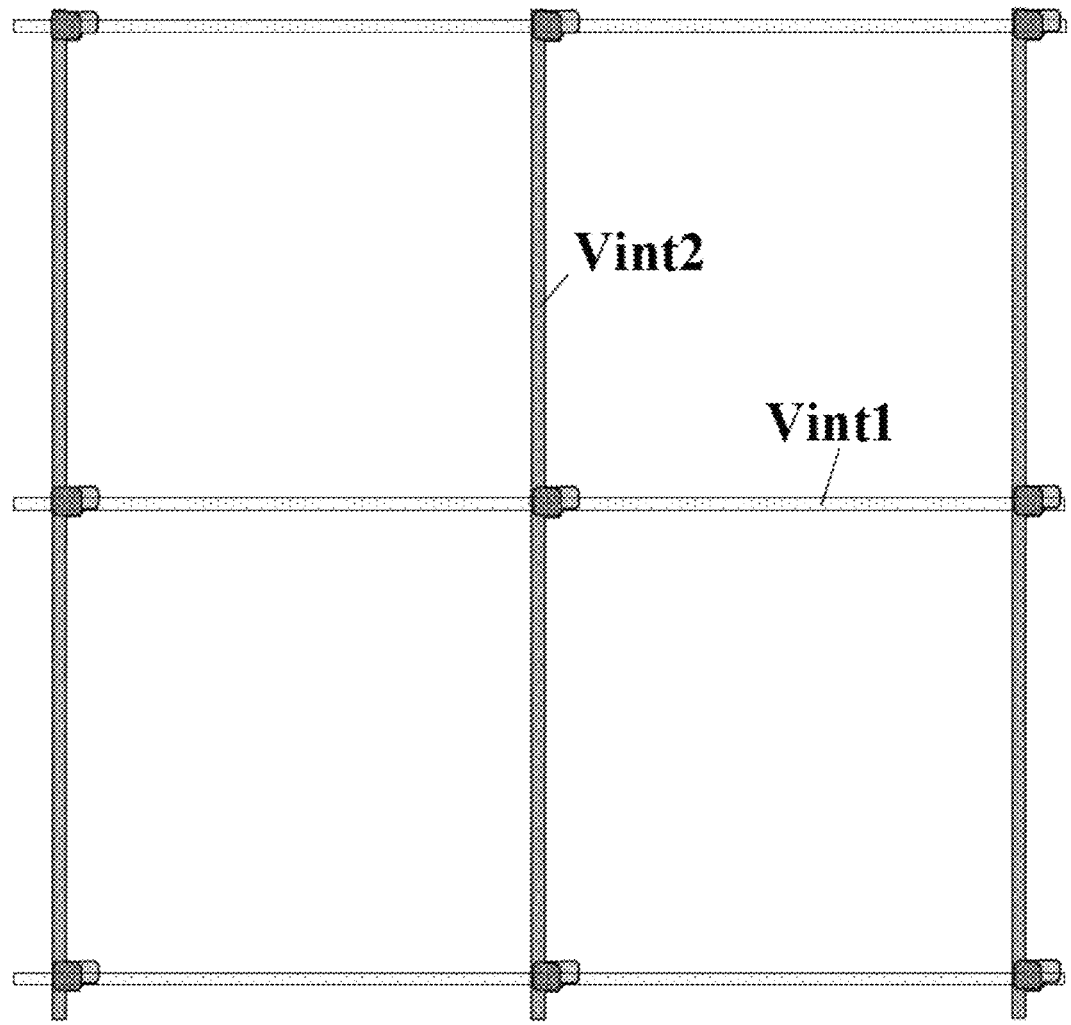
FIG. 6C is a diagram illustrating the structure of an interconnected reset signal supply network in a display panel in some embodiments according to the present disclosure.

FIG. 6C is a diagram illustrating the structure of an interconnected reset signal supply network in a display panel in some embodiments according to the present disclosure. Referring to FIG. 6A and FIG. 6C, the interconnected reset signal supply network in some embodiments includes a plurality of first reset signal lines Vint1 respectively along a first direction DR1; and a plurality of second reset signal lines Vint2 respectively along a second direction DR2. The plurality of first reset signal lines Vint1 respectively cross over the plurality of second reset signal lines Vint2. A respective one of the plurality of first reset signal lines Vint1 is connected to at least multiple ones of the plurality of second reset signal lines Vint2. A respective one of the plurality of second reset signal lines Vint2 is connected to at least multiple ones of the plurality of first reset signal lines Vint1.

Figure 5C:
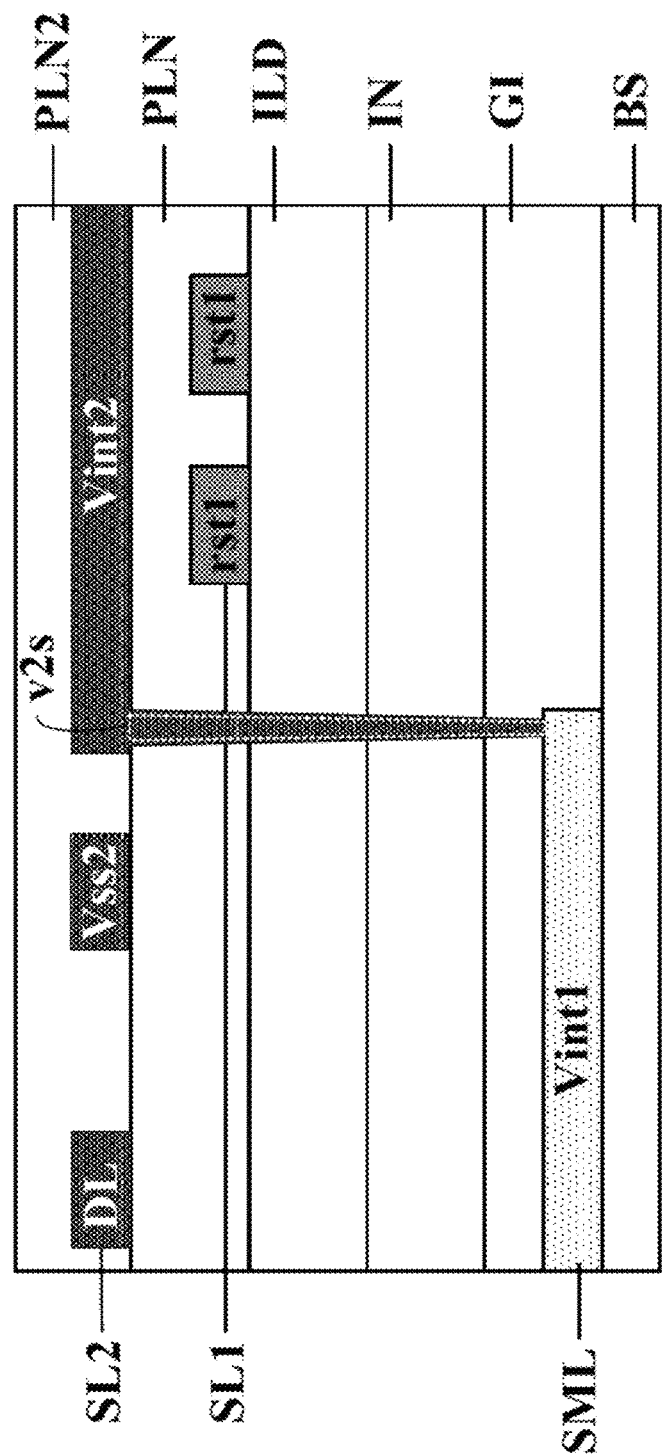
FIG. 5C is a cross-sectional view along a C-C' line in FIG. 4A.

FIG. 5C is a cross-sectional view along a C-C' line in FIG. 4A. Referring to FIG. 5C, FIG. 6A, and FIG. 6C, in some embodiments, the semiconductor material layer SML includes the plurality of first reset signal lines Vint1, and the second signal line layer SL2 includes the plurality of second reset signal lines Vint2. The plurality of first reset signal lines Vint1 and the plurality of second reset signal lines Vint2 interconnect through second vias v2s respectively extending through at least the planarization layer PLN. In one example, the plurality of first reset signal lines Vint1 and the plurality of second reset signal lines Vint2 interconnect through second vias v2s, a respective second via extending through the planarization layer PLN, the inter-layer dielectric layer ILD, the insulating layer IN, and the gate insulating layer GI. A respective one of the plurality of first reset signal lines Vint1 is connected to at least multiple ones of the plurality of second reset signal lines Vint2 respectively through multiple second vies extending through at least the planarization layer PLN. A respective one of the plurality of second reset signal lines Vint2 is connected to at least multiple ones of the plurality of first reset signal lines Vint1 respectively through multiple second vias extending through at least the planarization layer PLN.

Optionally, the plurality of first reset signal lines Vint1 include a semiconductor material; and the plurality of second reset signal lines Vint2 include a metallic material. Optionally, the plurality of first reset signal lines Vint1 and at least active layers (e.g., ACTd, and ACT1 to ACT6) of a plurality of thin film transistors (e.g., Td, and T1 to T6) are in the semiconductor material layer SML, and include a same semiconductor material.

Alternatively, the reset signal lines (one or both of the plurality of first reset signal lines Vint1 and the plurality of second reset signal lines Vint2) may be disposed in the first conductive layer. Alternatively, the reset signal lines (one or both of the plurality of first reset signal lines Vint1 and the plurality of second reset signal lines Vint2) may be disposed in the first signal line layer. Alternatively, the reset signal lines (one or both of the plurality of first reset signal lines Vint1 and the plurality of second reset signal lines Vint2) may be disposed in the second conductive layer. Alternatively, the reset signal lines (one or both of the plurality of first reset signal lines Vint1 and the plurality of second reset signal lines Vint2) may be disposed in the second signal line layer. Alternatively, the plurality of first reset signal lines Vint1 and the plurality of second reset signal lines Vint2 are in a same layer, interconnecting with each other to form a network.

Figure 6D:
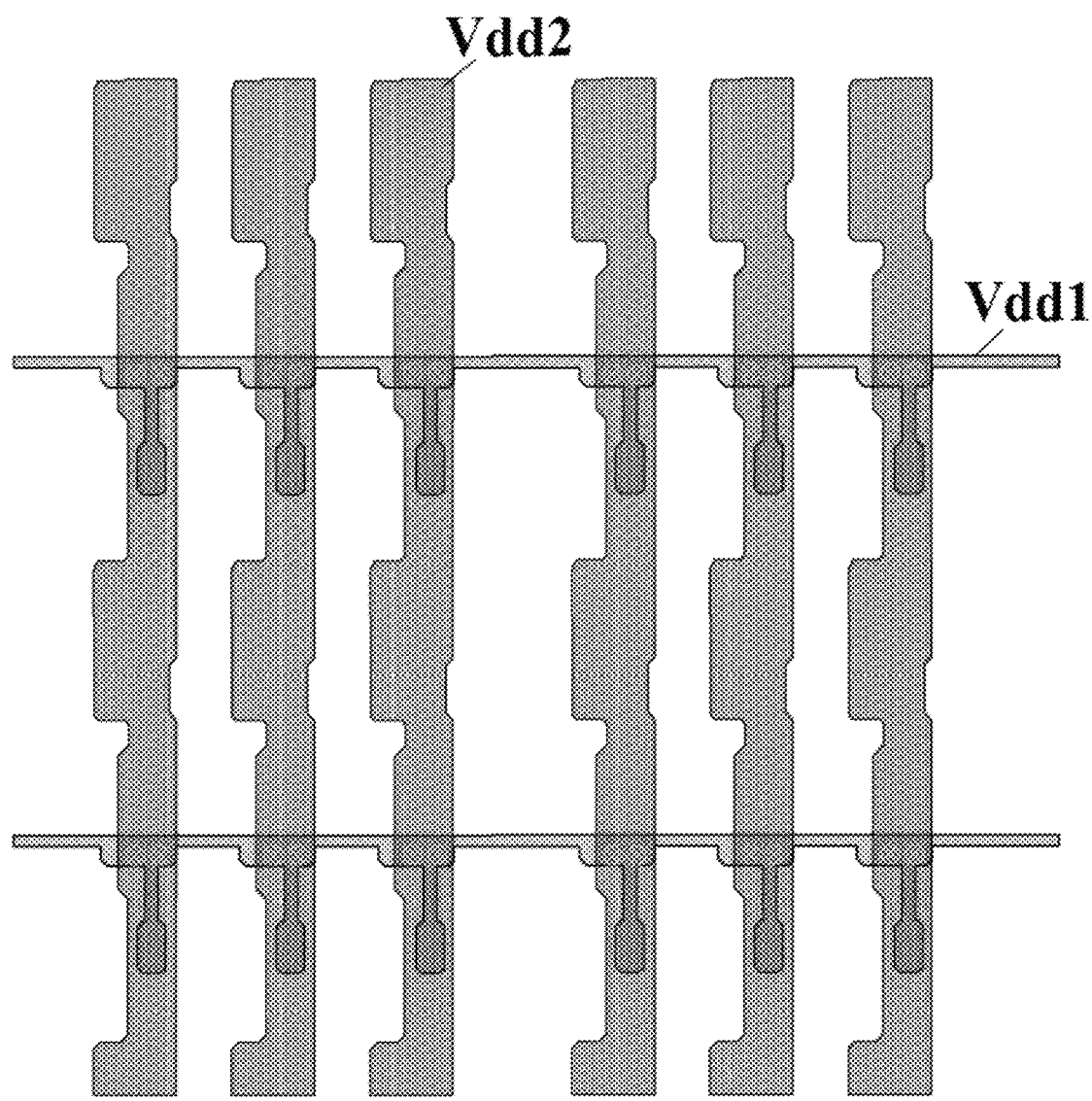
FIG. 6D is a diagram illustrating the structure of an interconnected high voltage supply network in a display panel in some embodiments according to the present disclosure.

FIG. 6D is a diagram illustrating the structure of an interconnected high voltage supply network in a display panel in some embodiments according to the present disclosure. Referring to FIG. 6A and FIG. 6D, the interconnected high voltage supply network in some embodiments includes a plurality of first high voltage signal lines Vdd1 respectively along a first direction DR1; and a plurality of second high voltage signal lines Vdd2 respectively along a second direction DR2. The plurality of first high voltage signal lines Vdd1 respectively cross over the plurality of second high voltage signal lines Vdd2. A respective one of the plurality of first high voltage signal lines Vdd1 is connected to at least multiple ones of the plurality of second high voltage signal lines Vdd2. A respective one of the plurality of second high voltage signal lines Vdd2 is connected to at least multiple ones of the plurality of first high voltage signal lines Vdd1.

Figure 5D:
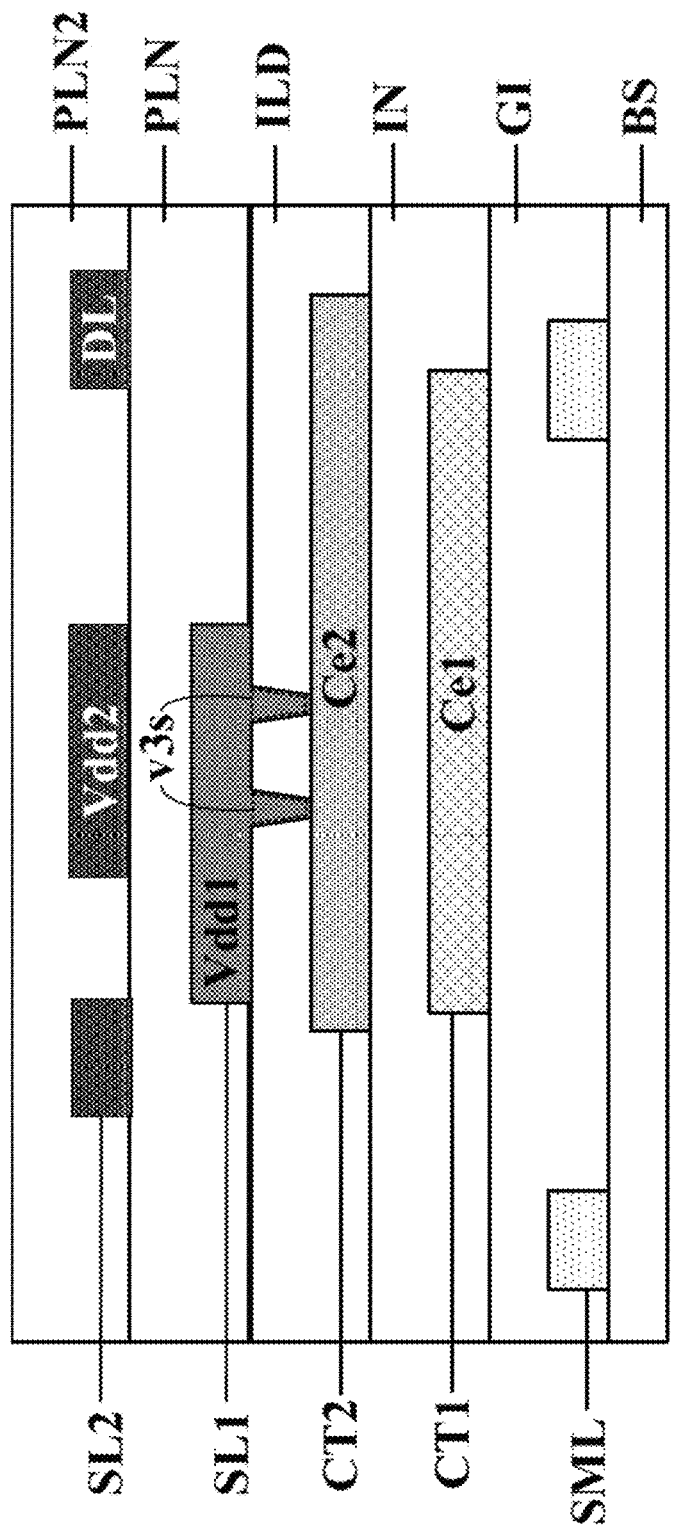
FIG. 5D is a cross-sectional view along a D-D' line in FIG. 4A.

FIG. 5D is a cross-sectional view along a D-D' line in FIG. 4A. Referring to FIG. 5D, FIG. 6A, and FIG. 6D, in some embodiments, the first signal line layer SL1 includes the plurality of first high voltage signal lines Vdd1, and the second signal line layer SL2 includes the plurality of second high voltage signal lines Vdd2. A respective one of the plurality of first high voltage signal lines Vdd1 is connected to second capacitor electrode through one or more third vias v3s respectively extending through the inter-layer dielectric layer ILD. A respective one of the plurality of first high voltage signal lines Vdd1 is connected to at least multiple ones of the plurality of second high voltage signal lines Vdd2 respectively through multiple third vias extending through the planarization layer PLN. A respective one of the plurality of second high voltage signal lines Vdd2 is connected to at least multiple ones of the plurality of first high voltage signal lines Vdd1 respectively through multiple third vias extending through the planarization layer PLN.

Figure 5E:
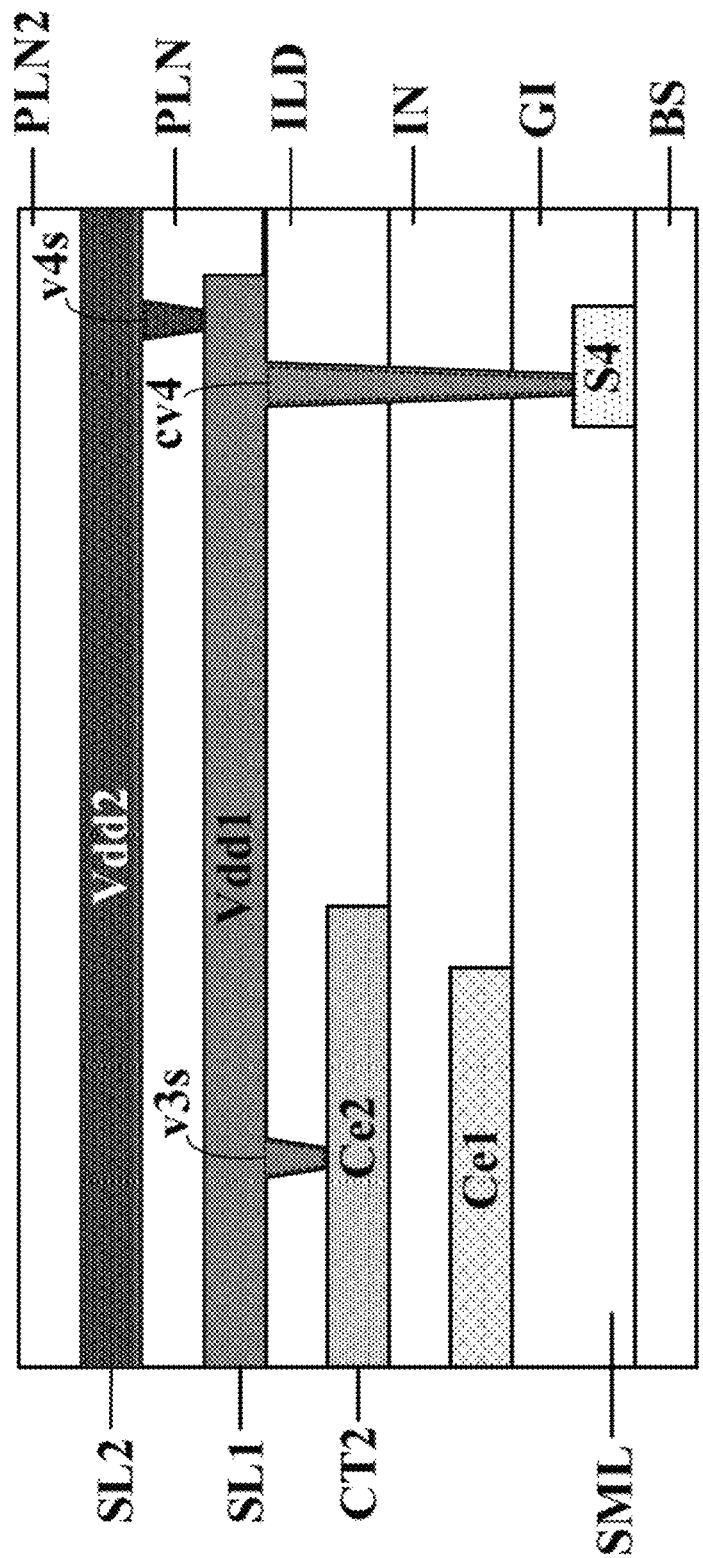
FIG. 5E is a cross-sectional view along a E-E' line in FIG. 4A.

FIG. 5E is a cross-sectional view along a E-E' line in FIG. 4A. Referring to FIG. 5E, FIG. 6A, and FIG. 6D, in some embodiments, the first signal line layer SL1 includes the plurality of first high voltage signal lines Vdd1, and the second signal line layer SL2 includes the plurality of second high voltage signal lines Vdd2. A respective one of the plurality of first high voltage signal lines Vdd1 is connected to second capacitor electrode through one or more third vias v3s respectively extending through the inter-layer dielectric layer ILD. A respective one of the plurality of second high voltage signal line Vdd2 is connected to a respective one of the plurality of first high voltage signal lines Vdd1 through one or more fourth vias v4s respectively extending through the planarization layer PLN. A respective one of the plurality of first high voltage signal lines Vdd1 is connected to the source electrode S4 of the fourth transistor through a third connecting via cv4 extending through the inter-layer dielectric layer ILD, the insulating layer IN, and the gate insulating layer G1.

Figure 4G:
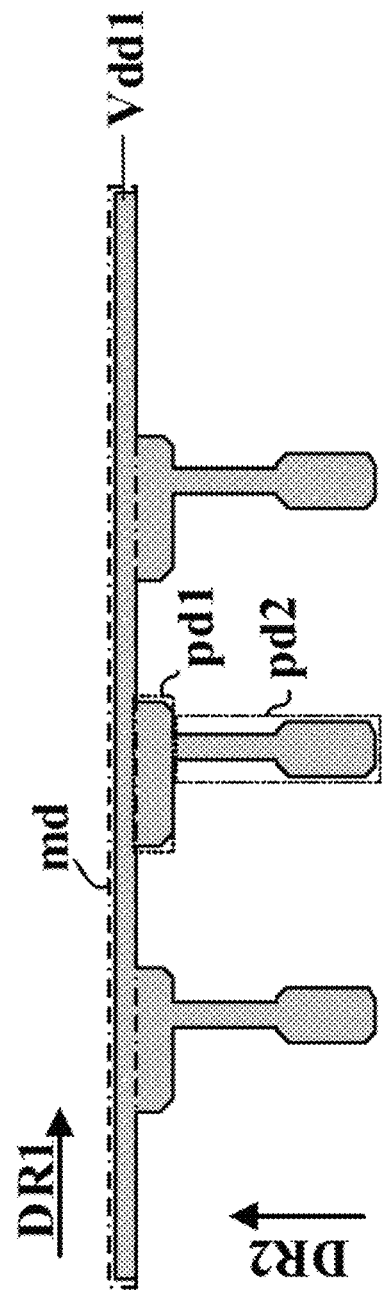
FIG. 4G is a diagram illustrating the structure of a respective one of a plurality of first high voltage signal lines in some embodiments according to the present disclosure.

FIG. 4G is a diagram illustrating the structure of a respective one of a plurality of first high voltage signal lines in some embodiments according to the present disclosure. Referring to FIG. 4G, the respective one of a plurality of first high voltage signal lines Vdd1 in some embodiments includes a main body and extending along the first direction DR1, a first protrusion pd1 protruding away from the main body and along the second direction DR2, and a second protrusion pd2 protruding away from the first protrusion pol along the second direction DR2. The second protrusion pd2 connects to the main body and through the first protrusion pd1. The first protrusion pd1 is a portion of the respective one of a plurality of first high voltage signal lines Vdd1 where the respective one of a plurality of first high voltage signal lines Vdd1 connects to the second capacitor electrode. The second protrusion pd2 is a portion of the respective one of a plurality of first high voltage signal lines Vdd1 where the respective one of a plurality of first high voltage signal lines Vdd1 connects to the source electrode of the fourth transistor. A drain electrode of the fourth transistor is connected to a source electrode of a driving transistor.

Figure 4H:
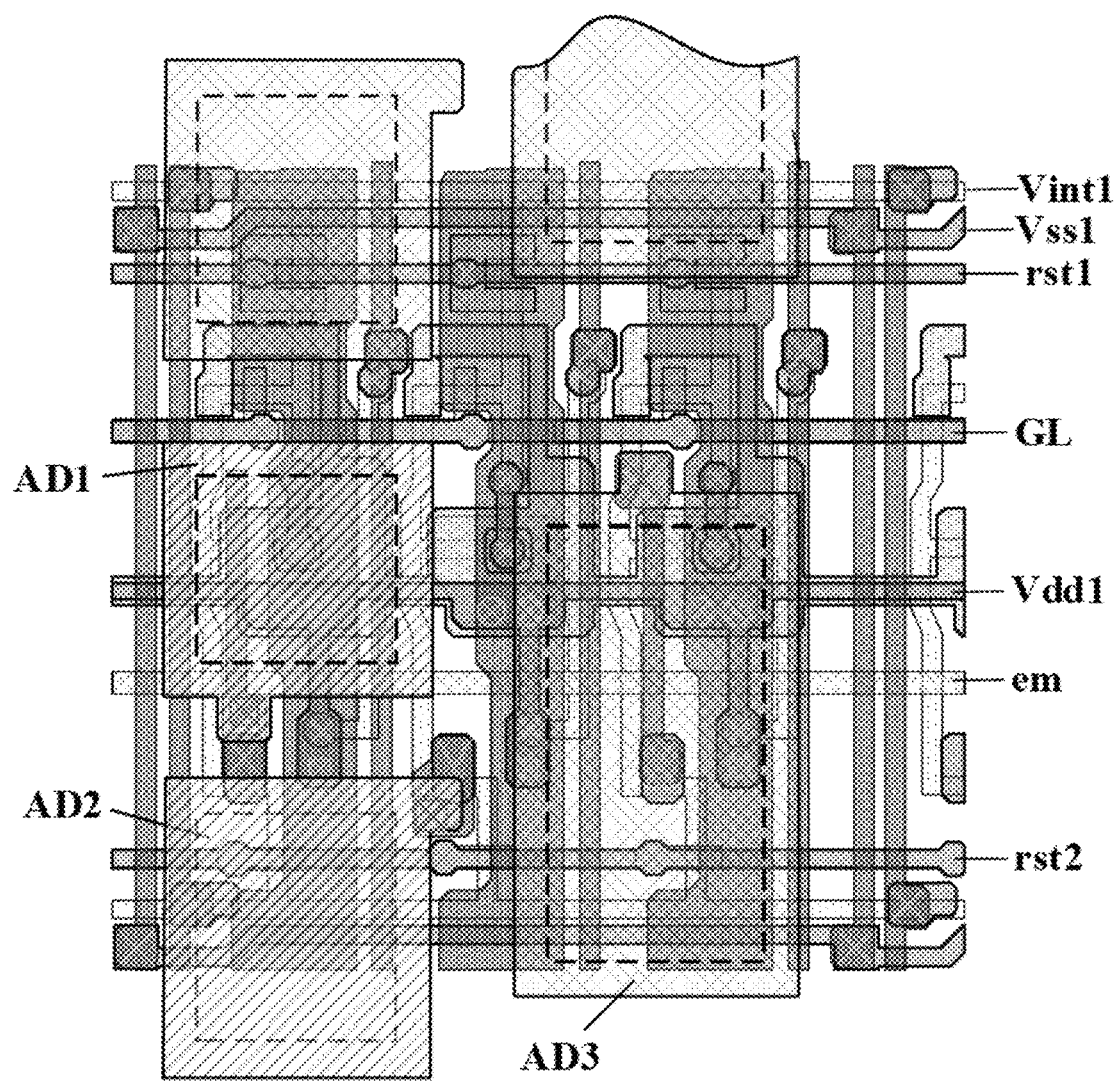
FIG. 4H is a diagram illustrating the layout of anodes of light emitting elements with respect to pixel driving circuits of a display panel in some embodiments according to the present disclosure.
Figure 4I:
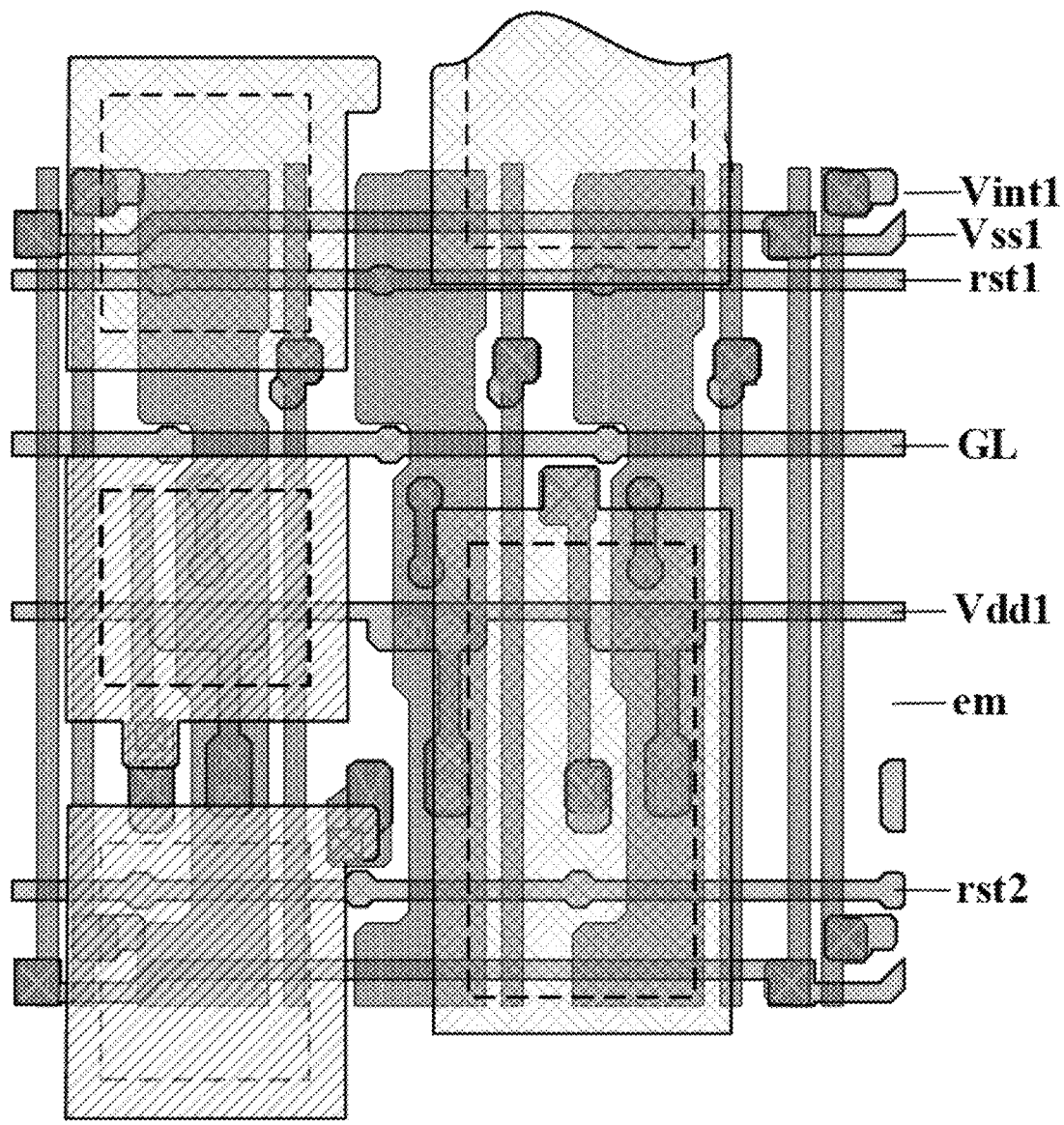
FIG. 4I is a diagram illustrating the structure of anodes, a first signal line layer, and a second signal line layer in a display panel in some embodiments according to the present disclosure.
Figure 4J:
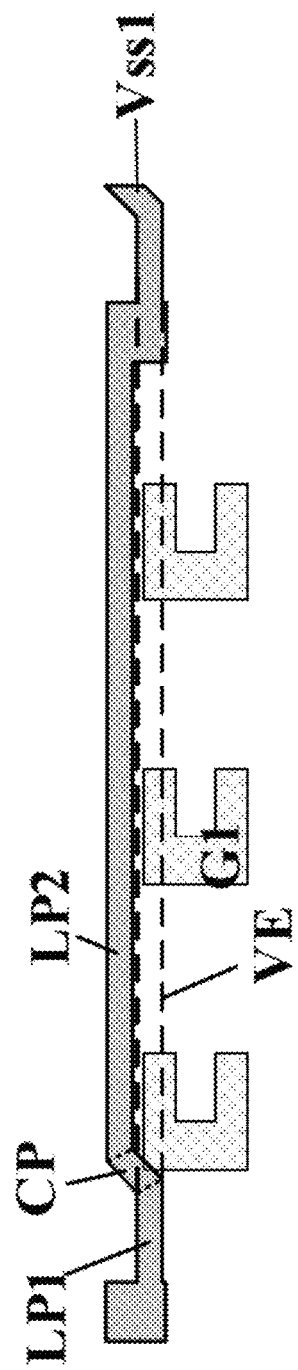
FIG. 4J is a diagram illustrating a relative position between a respective one of a plurality of first low voltage signal lines and a plurality of first metal blocks of a respective first reset control signal line in some embodiments according to the present disclosure.

FIG. 4H is a diagram illustrating the layout of anodes of light emitting elements with respect to pixel driving circuits of a display panel in some embodiments according to the present disclosure. FIG. 4I is a diagram illustrating the structure of anodes, a first signal line layer, and a second signal line layer in a display panel in some embodiments according to the present disclosure. Referring to FIG. 4H and FIG. 4I, the display panel in some embodiments further includes a plurality of anodes respectively of the plurality of light emitting elements, for example, a first anode AD1, a second anode AD2, and a third anode AD3 as depicted in FIG. 4H. A respective anode is connected to an anode contact pad through a via extending through a second planarization layer (e.g., PLN2 in FIG. 5A to FIG. 5E), and the anode contact pad is connected to a relay electrode through a via extending through the planarization layer (e.g., PLN in FIG. 5A to FIG. 5E). The relay electrode is connected to the N4 node (e.g., the drain electrode of the fifth transistor) through a via extending through the inter-layer dielectric layer.

Referring to FIG. 4H, FIG. 4I, FIG. 4E, and FIG. 4F, in one example, the first anode AD1 is connected to a first anode contact pad ACP1 through a via extending through the second planarization layer, the first anode contact pad ACP1 is connected to a first relay electrode RE1 through a via extending through the planarization layer; the second anode AD2 is connected to a second anode contact pad ACP2 through a via extending through the second planarization layer, the second anode contact pad ACP2 is connected to a second relay electrode RE2 through a via extending through the planarization layer; the third anode AD3 is connected to a third anode contact pad ACP3 through a via extending through the second planarization layer, the third anode contact pad ACP3 is connected to a third relay electrode RE3 through a via extending through the planarization layer.

Figure 7A:
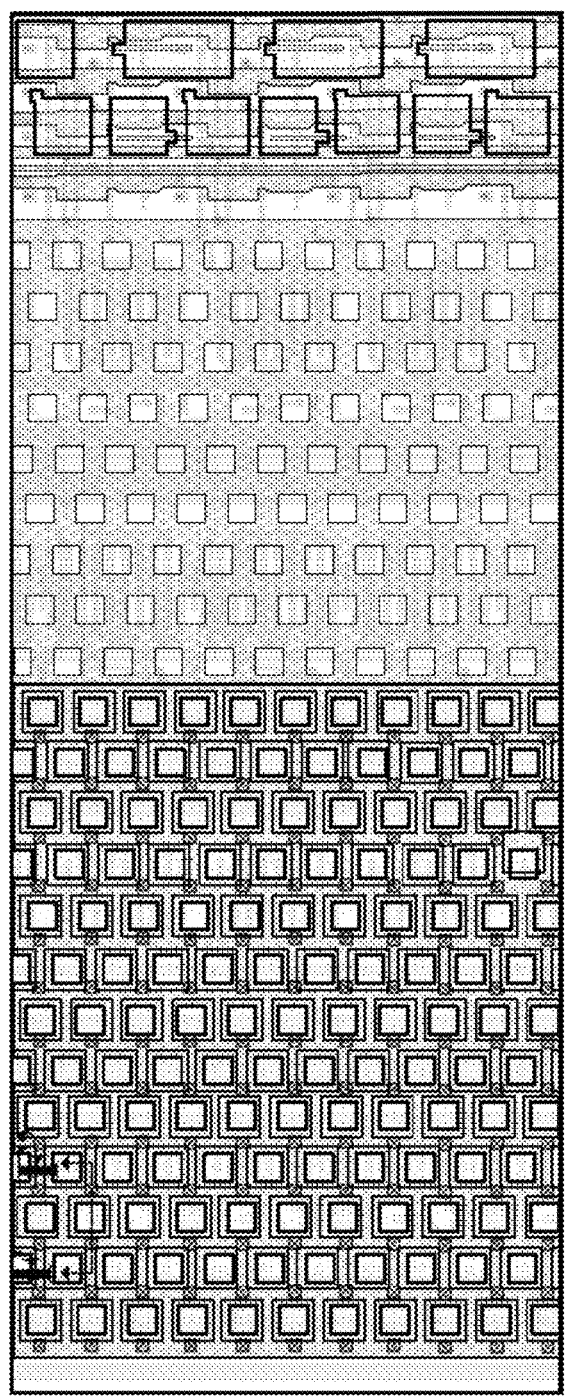
FIG. 7A is a schematic diagram illustrating the structure in a first region ZR1 in FIG. 1.
Figure 7B:
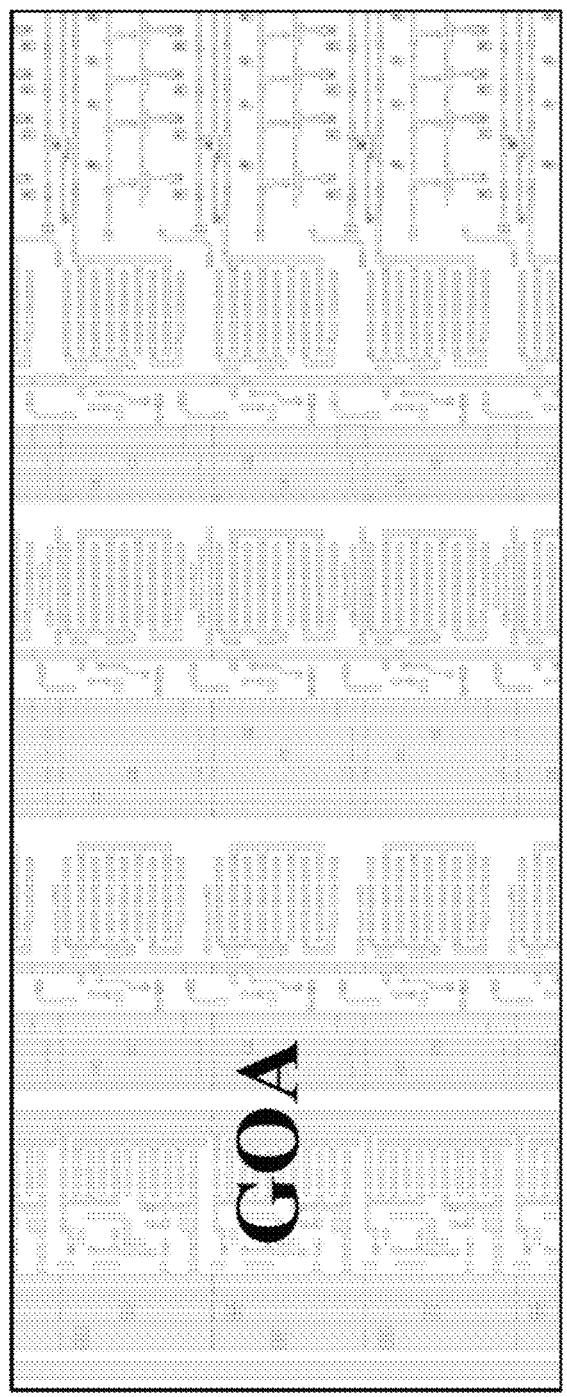
FIG. 7B is a diagram illustrating the structure of a first signal line layer in a first region ZR1 depicted in FIG. 7A.
Figure 7C:
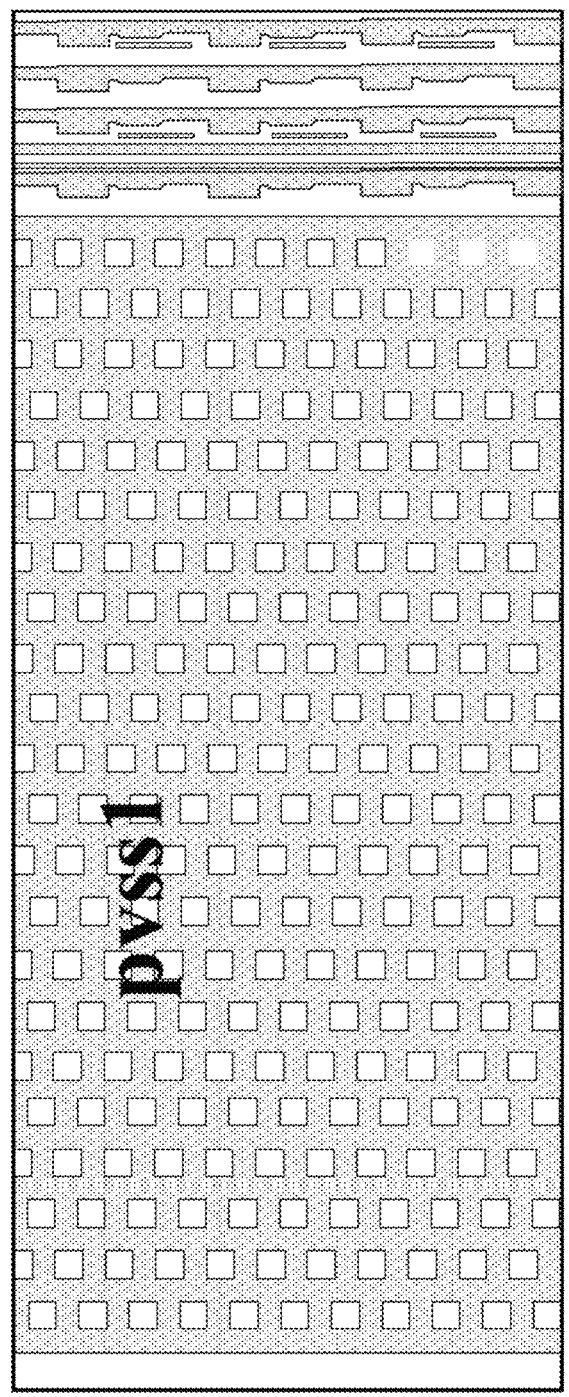
FIG. 7C is a diagram illustrating the structure of a second signal line layer in a first region ZR1 depicted in FIG. 7A.
Figure 7D:
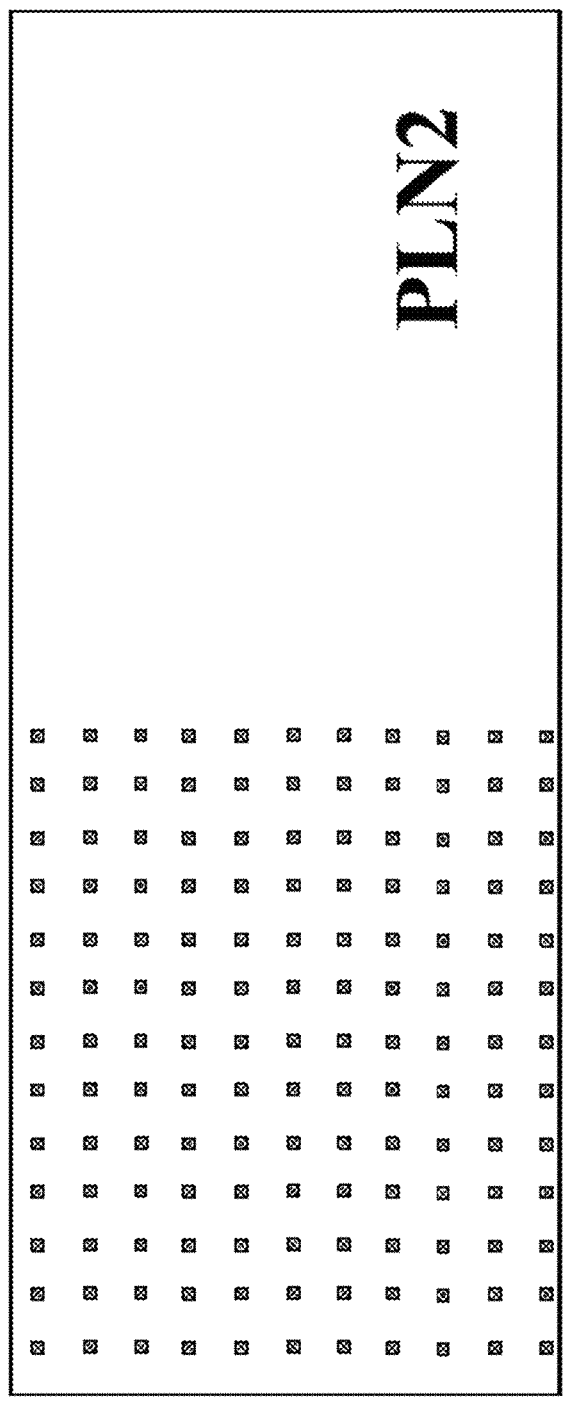
FIG. 7D is a diagram illustrating the structure of a second planarization layer in a first region ZR1 depicted in FIG. 7A.
Figure 7E:
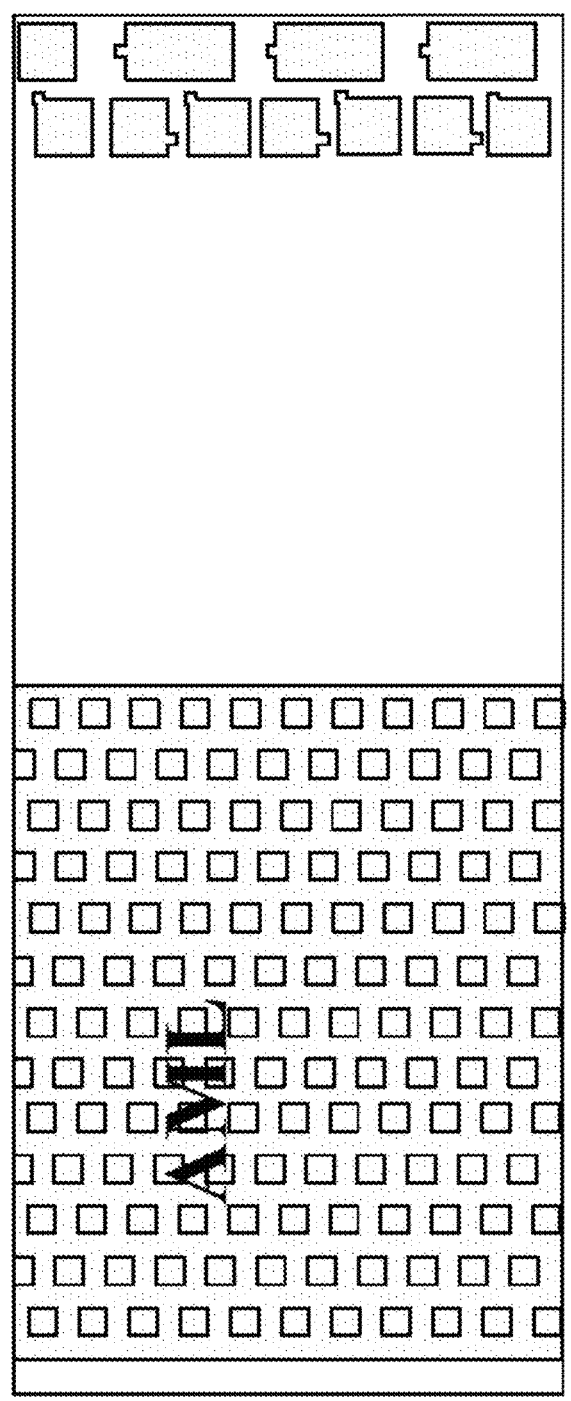
FIG. 7E is a diagram illustrating the structure of an anode layer in a first region ZR1 depicted in FIG. 7A.
Figure 7F:
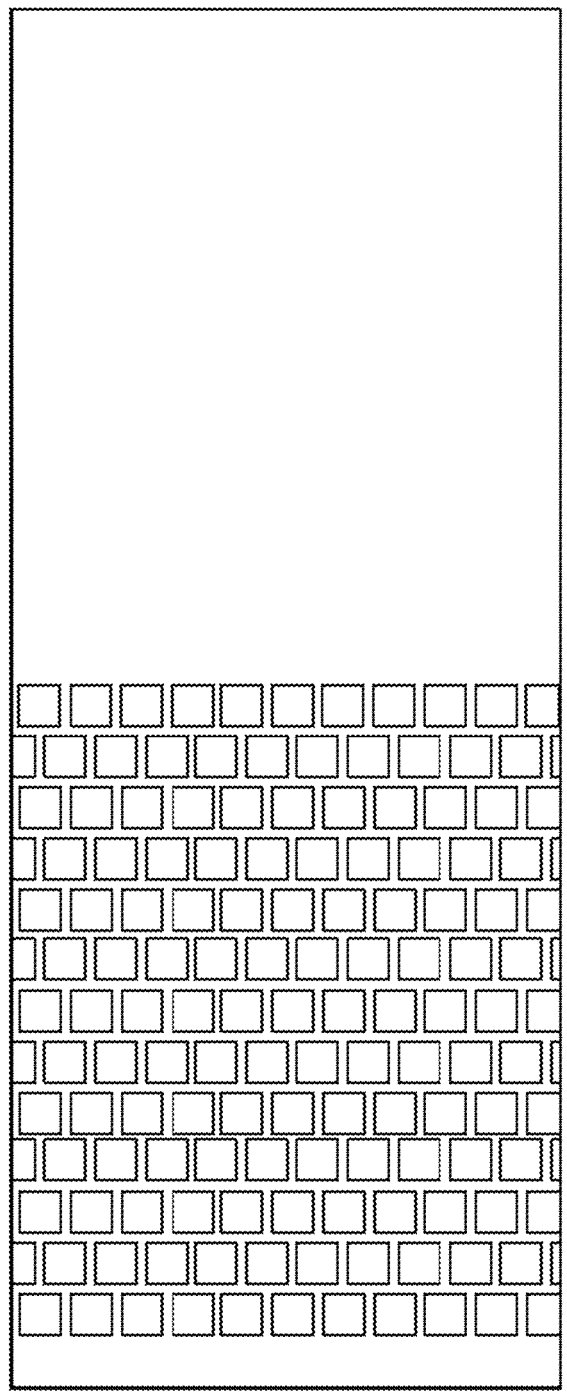
FIG. 7F is a diagram illustrating the structure of a third planarization layer in a first region ZR1 depicted in FIG. 7A.
Figure 7G:
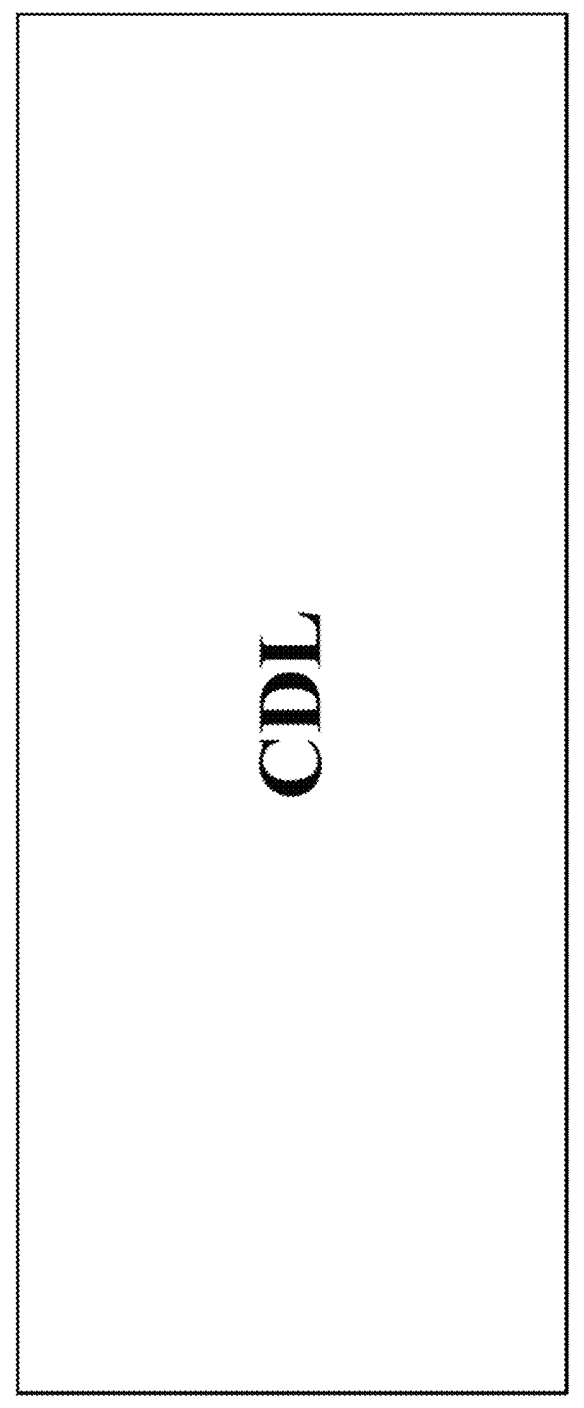

In some embodiments, referring to FIG. 1, the display panel further includes a gate-on-array circuit GOA in a peripheral area PA of the display panel. The interconnected low voltage supply network VSSN includes a first peripheral low voltage line pvss1 in the peripheral area PA on a first side S1 of the display panel. FIG. 7A is a schematic diagram illustrating the structure in a first zoom-in region ZR1 in FIG. 1. FIG. 7B is a diagram illustrating the structure of a first signal line layer in a first region ZR1 depicted in FIG. 7A. FIG. 7C is a diagram illustrating the structure of a second signal line layer in a first region ZR1 depicted in FIG. 7A. FIG. 7D is a diagram illustrating the structure of a second planarization layer in a first region ZR1 depicted in FIG. 7A. FIG. 7E is a diagram illustrating the structure of an anode layer in a first region ZR1 depicted in FIG. 7A. FIG. 7F is a diagram illustrating the structure of a third planarization layer in a first region ZR1 depicted in FIG. 7A. FIG. 7G is a diagram illustrating the structure of a cathode layer in a first region ZR1 depicted in FIG. 7A. Referring to FIG. 7A to FIG. 7G, and FIG. 1, the display panel in the peripheral area PA on the first side S1 of the display panel include a gate-on-array circuit GOA in the first signal line layer on a base substrate, a first peripheral low voltage line pvss1 in the second signal line layer on a side of the gate-on-array circuit GOA away from the base substrate, a second planarization layer PLN2 on a side of the first peripheral low voltage line puss away from the gate-on-array circuit GOA, an anode metal layer AML in an anode layer on a side of the second planarization layer PLN2 away from the first peripheral low voltage line pvss1, a third planarization layer PLN3 on a side of the anode metal layer AML away from the second planarization layer PLN2, and a cathode layer CDL on a side of the third planarization layer PLN3 away from the anode metal layer AML.

Figure 8:
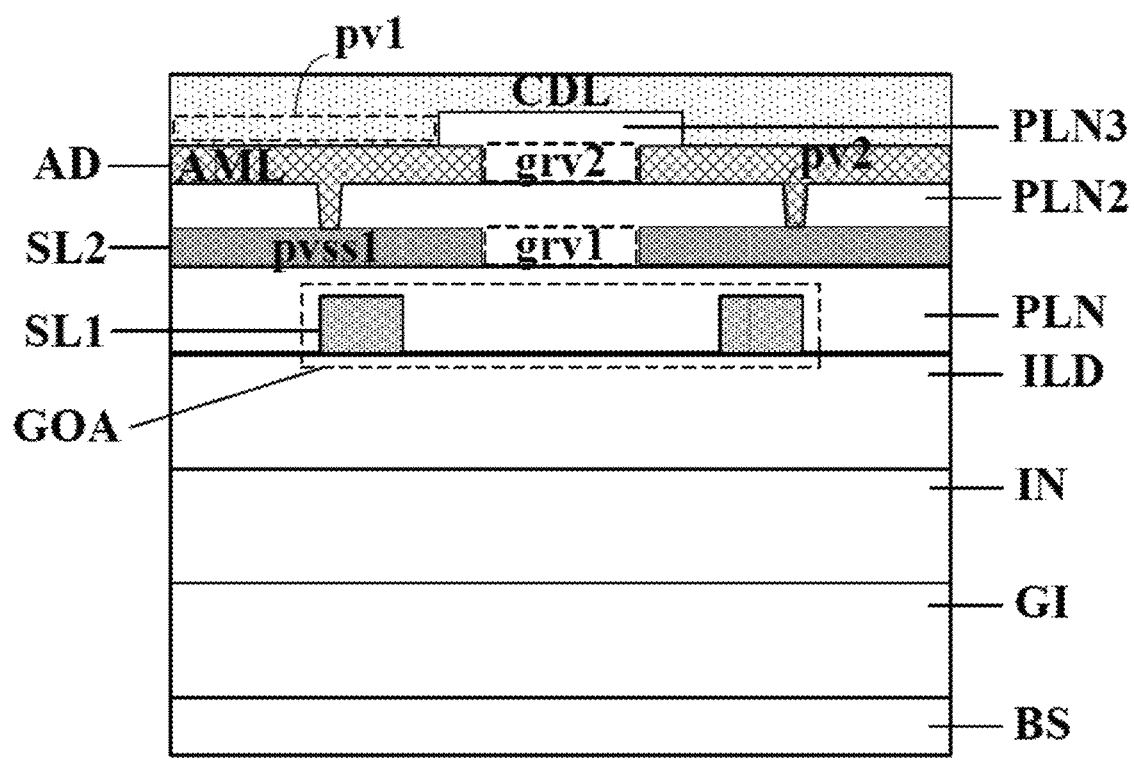
FIG. 8 is a cross-sectional view along an F-F' line in FIG. 7A.

FIG. 8 is a cross-sectional view along an F-F' line in FIG. 7A. Referring to FIG. 1, FIG. 7, and FIG. 8, in some embodiments, an orthographic projection of the first peripheral low voltage line pvss1 on a base substrate BS at least partially overlaps with an orthographic projection of the gate-on-array circuit GOA on the base substrate BS. Optionally, the orthographic projection of the first peripheral low voltage line pvss1 on a base substrate BS at least 80% (e.g., at least 85%, at least 90%, at least 95%, at least 99%) overlaps with the orthographic projection of the gate-on-array circuit GOA on the base substrate BS.

Referring to FIG. 8, the cathode layer CDL is connected to the anode metal layer AML through one or more first peripheral vias pv1 in the peripheral area and extending through a third planarization layer PLN3, and the anode metal layer AML is connected to the first peripheral first voltage line pvss1 through one or more second peripheral vias pv2 in the peripheral area and extending through a second planarization layer PLN2, thereby providing the first voltage signal to the cathodes of the plurality of light emitting elements. The display panel includes a plurality of first gas releasing vias grv1 extending through the first peripheral first voltage line pvss1 for releasing gases in underneath insulating layer (e.g., the planarization layer PLN) during a fabrication process of the display panel. The display panel further includes a plurality of second gas releasing vias grv2 extending through the anode metal layer AML for releasing gases in underneath insulating layer (e.g., the second planarization layer PLN2) during a fabrication process of the display panel.

In some embodiments, the cathode layer CDL is a unitary cathode layer extending substantially throughout the display panel and functions as cathodes for the plurality of light emitting elements. Optionally, the one or more vias connecting the cathode layer CDL and the anode metal layer AML are limited in the peripheral area PA, and absent in the display area DA. The cathode layer CDL is connected to the interconnected low voltage supply network VSSN only through the anode metal layer AML.

In the present display panel, the low voltage line shares a same space as the gate-on-array circuit GOA. The display panel can be made with a very narrow bezel. In one example, the present display panel has a bezel width on the first side S1 (or the side opposite to the first side S1) of approximately 1.5 mm, as compared to 2.5 mm in a related display panel.

Moreover, in the present display panel, the connection between the low voltage line and the cathode layer CDL (through the anode metal layer) may be made exclusively in the peripheral area PA (e.g., in the GOA region), obviating the need of making vias (or any process at all) in the display area DA to connect the low voltage line and the cathode layer CDL. The display panel can be fabricated with much less complexity, significantly lowering occurrence of defects in the display panel.

Figure 9A:
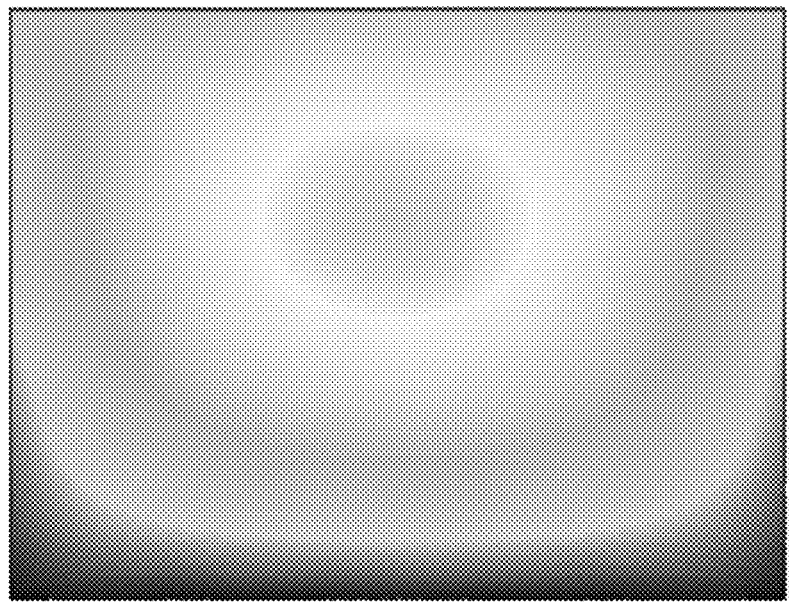
FIG. 9A shows an IR drop in a display panel in some embodiments according to the present disclosure.
Figure 9B:
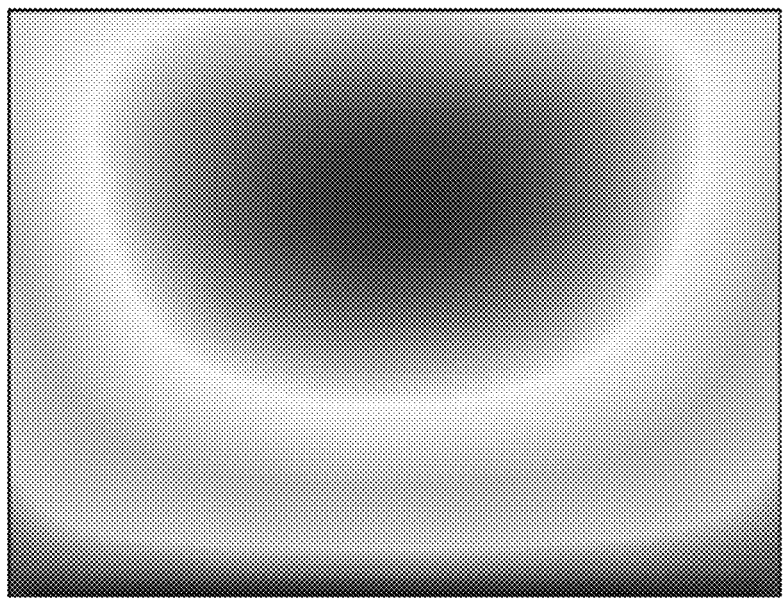
FIG. 9B shows an IR drop in a related display panel without an interconnected low voltage supply network.

The inventors of the present disclosure discover that, surprisingly and unexpectedly, the implementation of the interconnected low voltage supply network dramatically reduces a degree of voltage drop of the low voltage signal (e.g., the VSS signal) throughout the display panel. FIG. 9A shows an IR drop in a display panel in some embodiments according to the present disclosure. FIG. 9B shows an IR drop in a related display panel without an interconnected low voltage supply network. In FIG. 9A and FIG. 9B, a degree of darkness indicates a degree of IR drop in a local region. Comparing FIG. 9A and FIG. 9B, the degree of voltage drop in the embodiments according to the present disclosure is dramatically reduced as compared to the degree of voltage drop in the related display panel without an interconnected low voltage supply network. Overall, the IR drop is reduced from 1.5641 V to 1.2337 V (more than 20% reduction). The advantages of the present display panel are particularly meaningful for large size display panels. In the related display panel without an interconnected low voltage supply network, as shown in FIG. 9B, the VSS current concentrates at outmost two ports, leading to issues such as high current burns. For example, in the related display panel without an interconnected low voltage supply network, the VSS current at the outmost port is about 26.6% of the total VSS current. In the display panel in some embodiments according to the present disclosure, the VSS current at any port is less than 11% of the total VSS current, obviating the issue of large current burns.

Figure 10A:
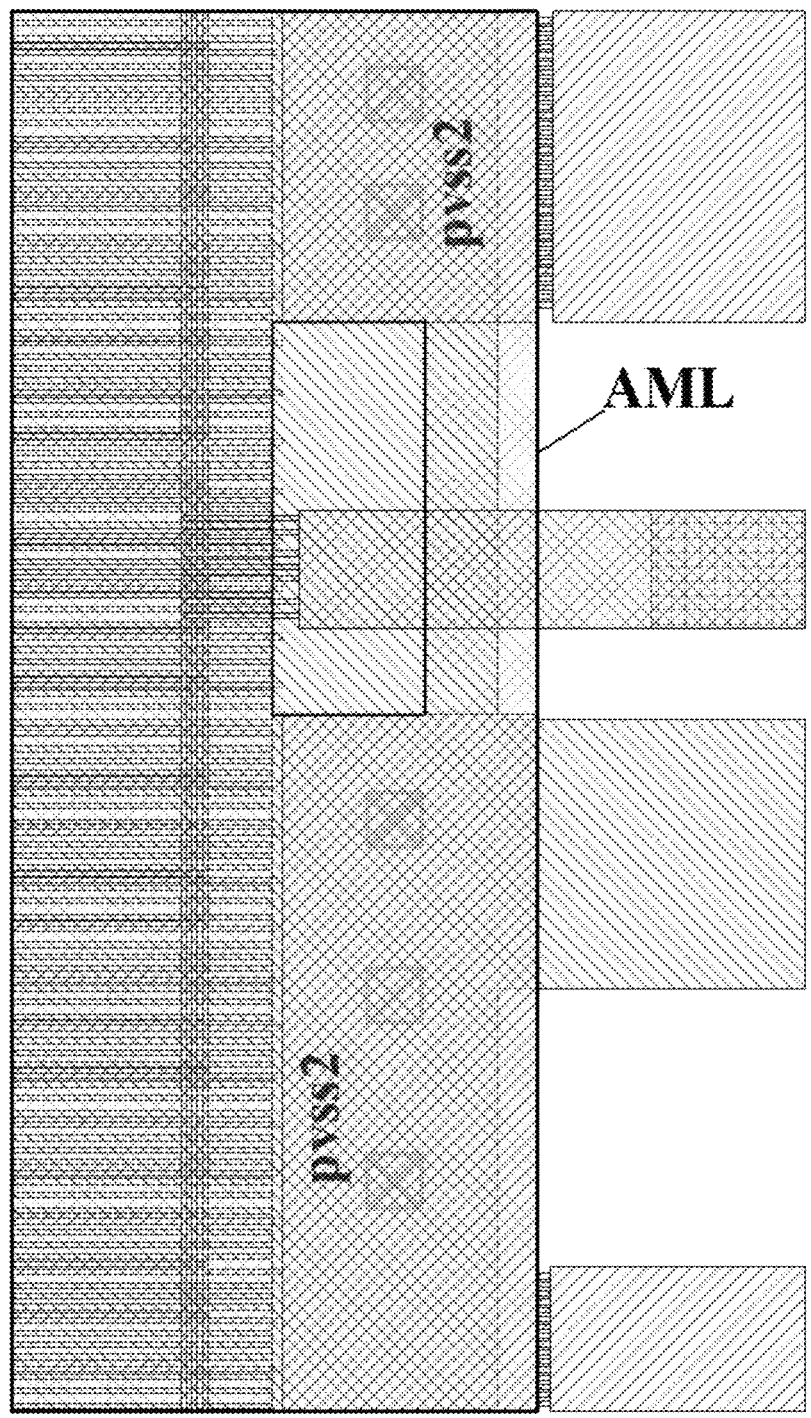
FIG. 10A is a schematic diagram illustrating the structure in a second zoom-in region ZR2 in FIG. 1.
Figure 10B:
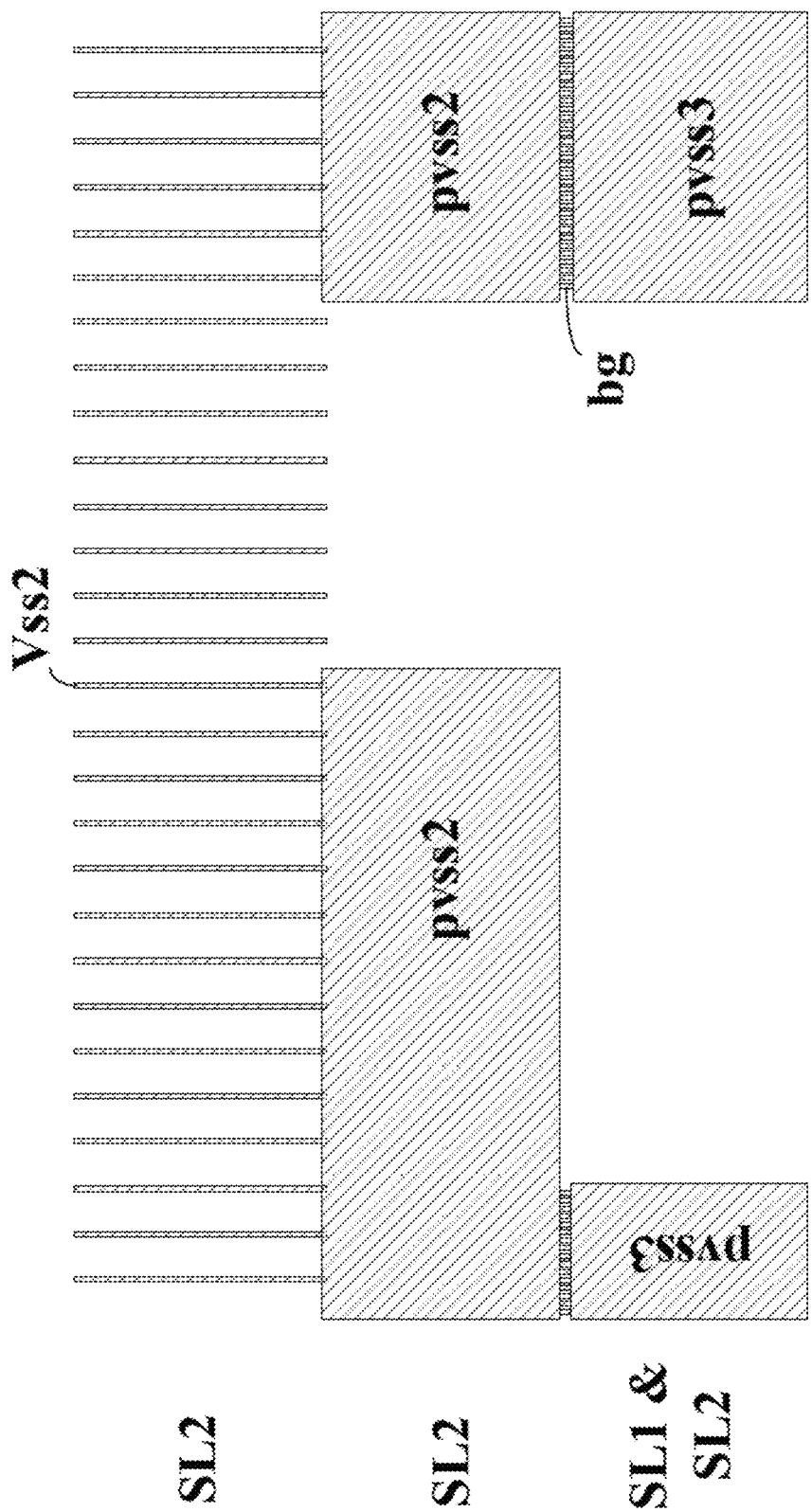
FIG. 10B is a schematic diagram illustrating the structure of low voltage signal lines in FIG. 10A.
Figure 10C:
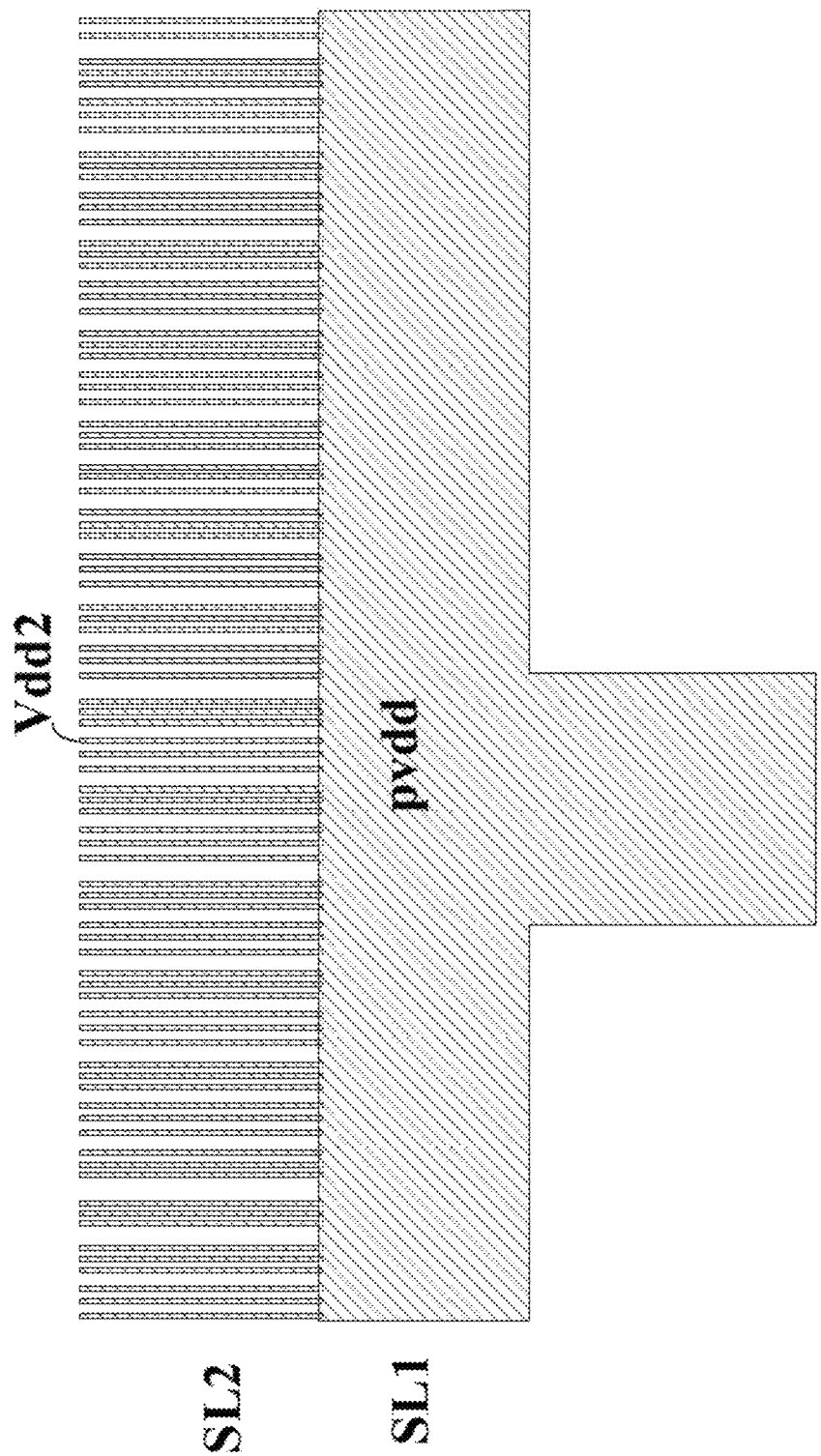
FIG. 10C is a schematic diagram illustrating the structure of high voltage signal lines in FIG. 10A.

To accommodate the implementation of the interconnected network in the present display panel, the layers and signal lines in the peripheral area have adopted a novel and unique structure that is advantageous in further reducing the bezel width, improving voltage uniformity throughout the display panel, and minimizing occurrence of defects in the display panel. FIG. 10A is a schematic diagram illustrating the structure in a second zoom-in region ZR2 in FIG. 1. FIG. 10B is a schematic diagram illustrating the structure of low voltage signal lines in FIG. 10A. FIG. 10C is a schematic diagram illustrating the structure of high voltage signal lines in FIG. 104. Referring to FIG. 1, FIG. 10A, FIG. 10B, and FIG. 10C, in some embodiments, the display panel includes a peripheral high voltage signal line pvdd, a second peripheral low voltage signal line pvss2, and a third peripheral low voltage signal line pvss3 in the peripheral area PA on a second side S2 of the display panel. One or more of the plurality of second high voltage signal lines Vdd2 are connected to the peripheral high voltage signal line pvdd. One or more of the plurality of second low voltage signal lines Vss2 are connected to the second peripheral low voltage signal line pvss2. The second peripheral low voltage signal line pvss2 and the third peripheral low voltage signal line pvss3 are connected to each other through a plurality of bridges bg. Optionally, the plurality of first low voltage signal lines, the peripheral high voltage signal line pvdd, and the plurality of bridges are in a first signal line layer SL1 (referring to, e.g., FIG. 5A for layer arrangement of the display panel). Optionally, the plurality of second high voltage signal lines Vdd2, the second peripheral low voltage signal line pvss2 are in a second signal line layer SL2. Optionally, the third peripheral low voltage signal line pvss3 includes a first sub-layer in the first signal line layer SL1 and a second sub-layer in the second signal line layer SL2.

Figure 10D:
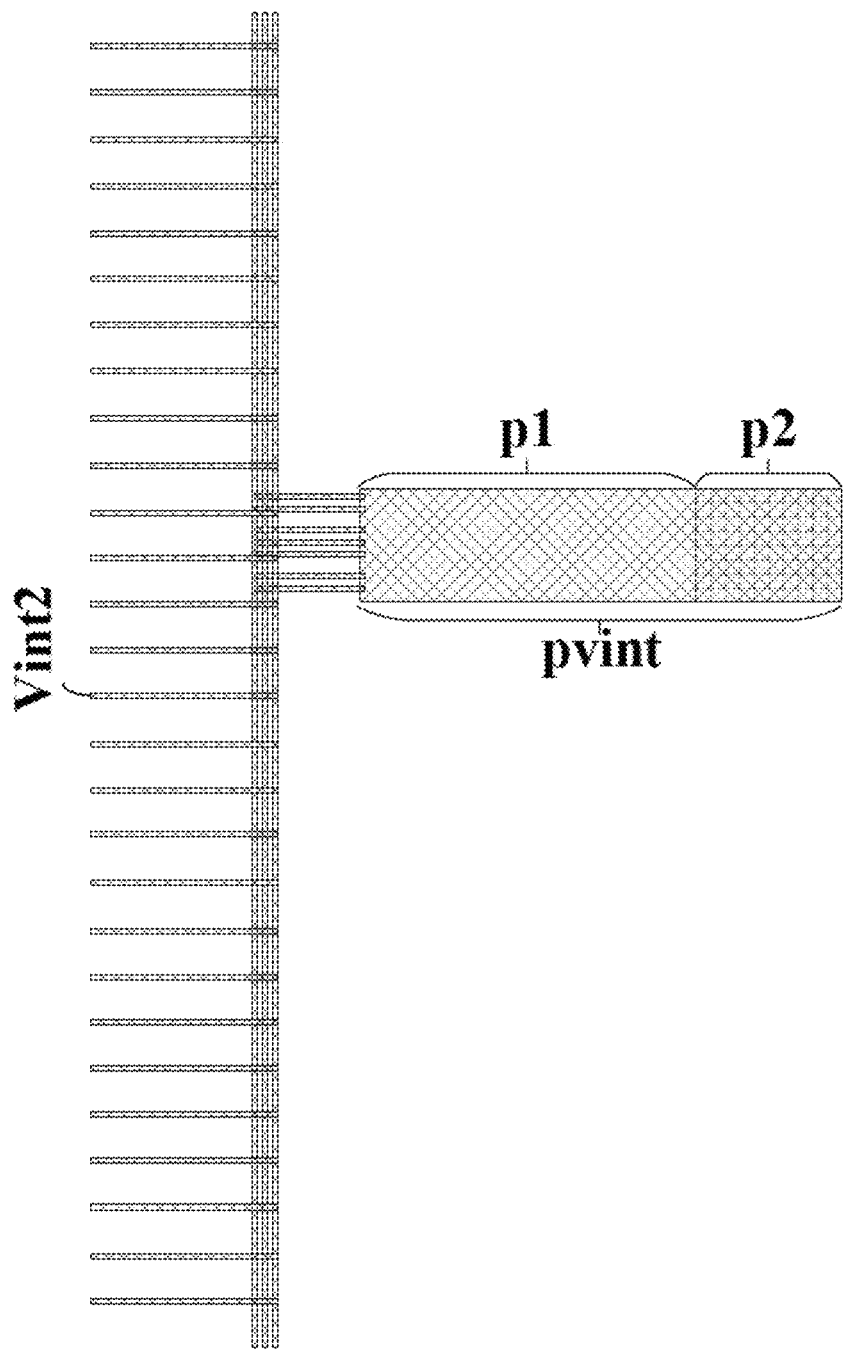
FIG. 10D is a schematic diagram illustrating the structure of reset signal lines in FIG. 10A.

FIG. 10D is a schematic diagram illustrating the structure of reset signal lines in FIG. 10A. Referring to FIG. 1, FIG. 10A, and FIG. 10D, in some embodiments, the display panel includes a peripheral reset signal line pvint in the peripheral area PA on a second side S2 of the display panel. One or more of the plurality of second reset signal lines Vint2 are connected to the peripheral reset signal line point. Optionally, the peripheral reset signal line pvint is in a layer different from the peripheral high voltage signal line pvdd and the peripheral low voltage signal line pvss2. Optionally, the peripheral reset signal line pvint is in a same layer as the plurality of second reset signal lines Vint2. Optionally, the peripheral reset signal line pvint is in a layer different from the plurality of second reset signal lines Vint2. In some embodiments, the peripheral reset signal line pvint includes a first part p1 and a second part p2. Optionally, the first part p1 includes a single layer conductive material in a same layer as the second signal line layer. Optionally, the second part has a double-layer structure including conductive materials respectively in the first signal line layer and the second signal line layer.

Referring to FIG. 10A, in some embodiments, the display panel further include a anode metal layer AML. In some embodiments, the anode metal layer AML is connected to the peripheral low voltage signal line pvss2 through vias extending through one or more insulating layers.

Figure 11A:
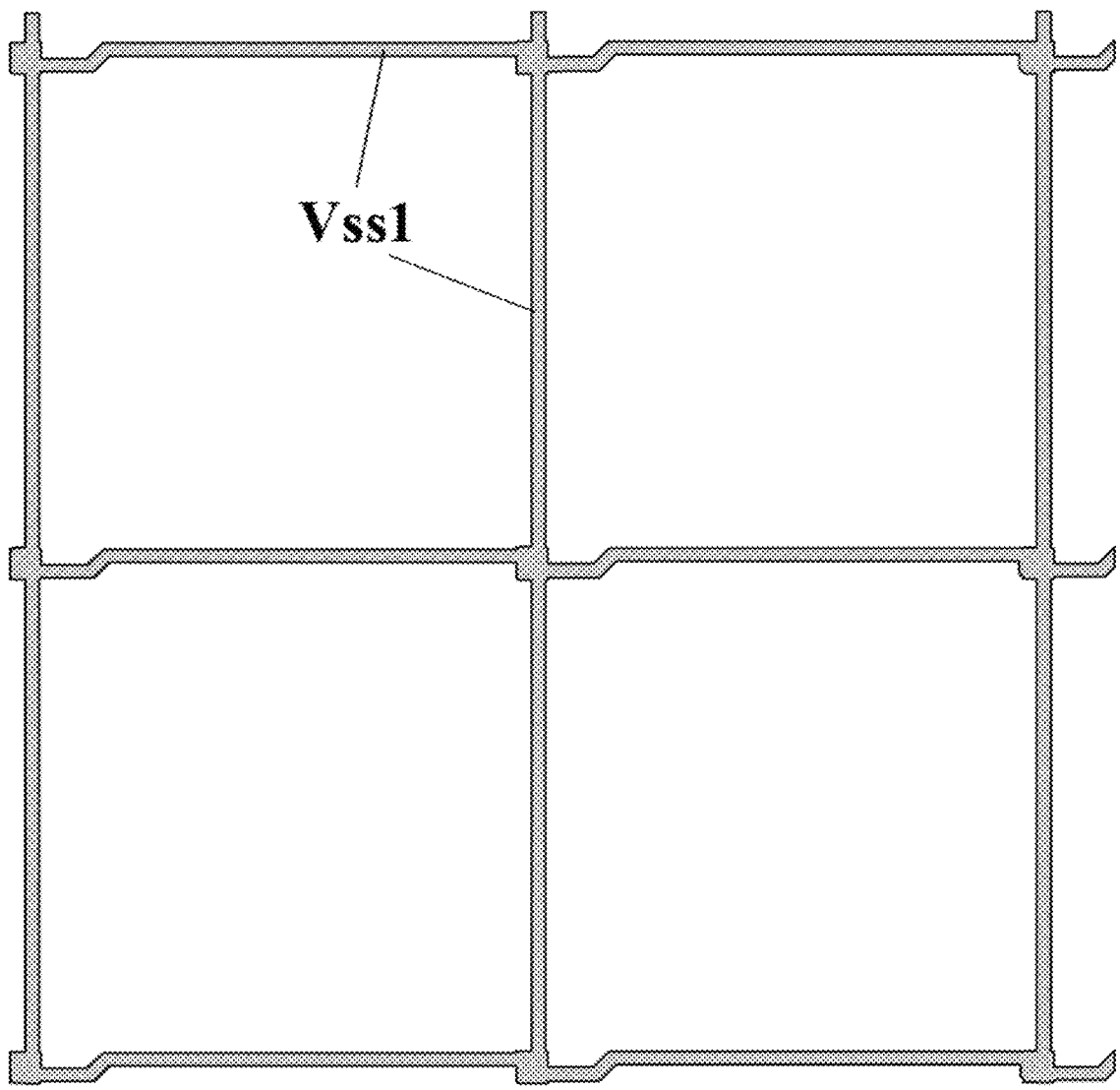
FIG. 11A is a diagram illustrating the structure of a first sub-network of an interconnected low voltage supply network in some embodiments according to the present disclosure.
Figure 11B:
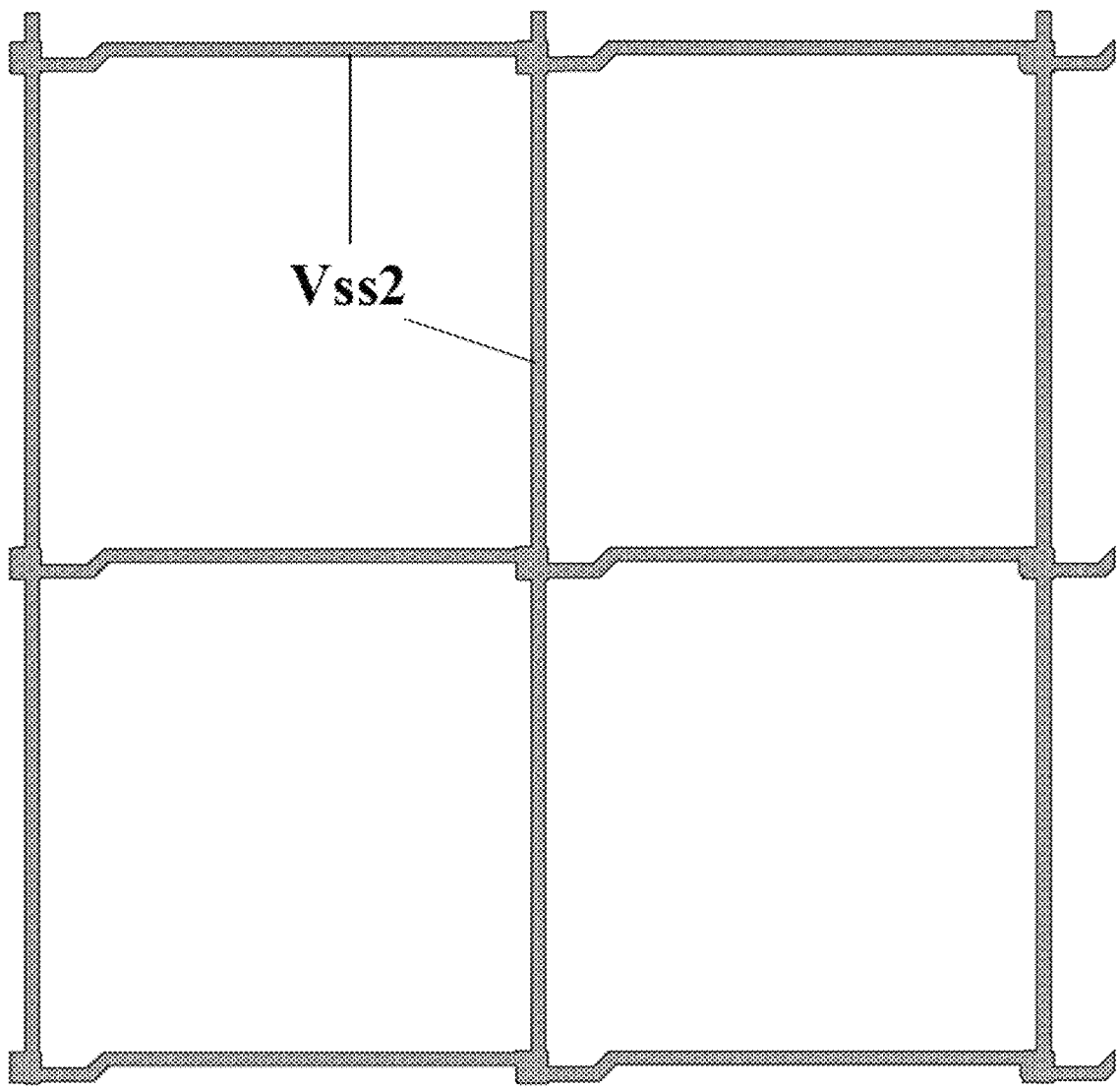
FIG. 11B is a diagram illustrating the structure of a second sub-network of an interconnected low voltage supply network in some embodiments according to the present disclosure.
Figure 11C:
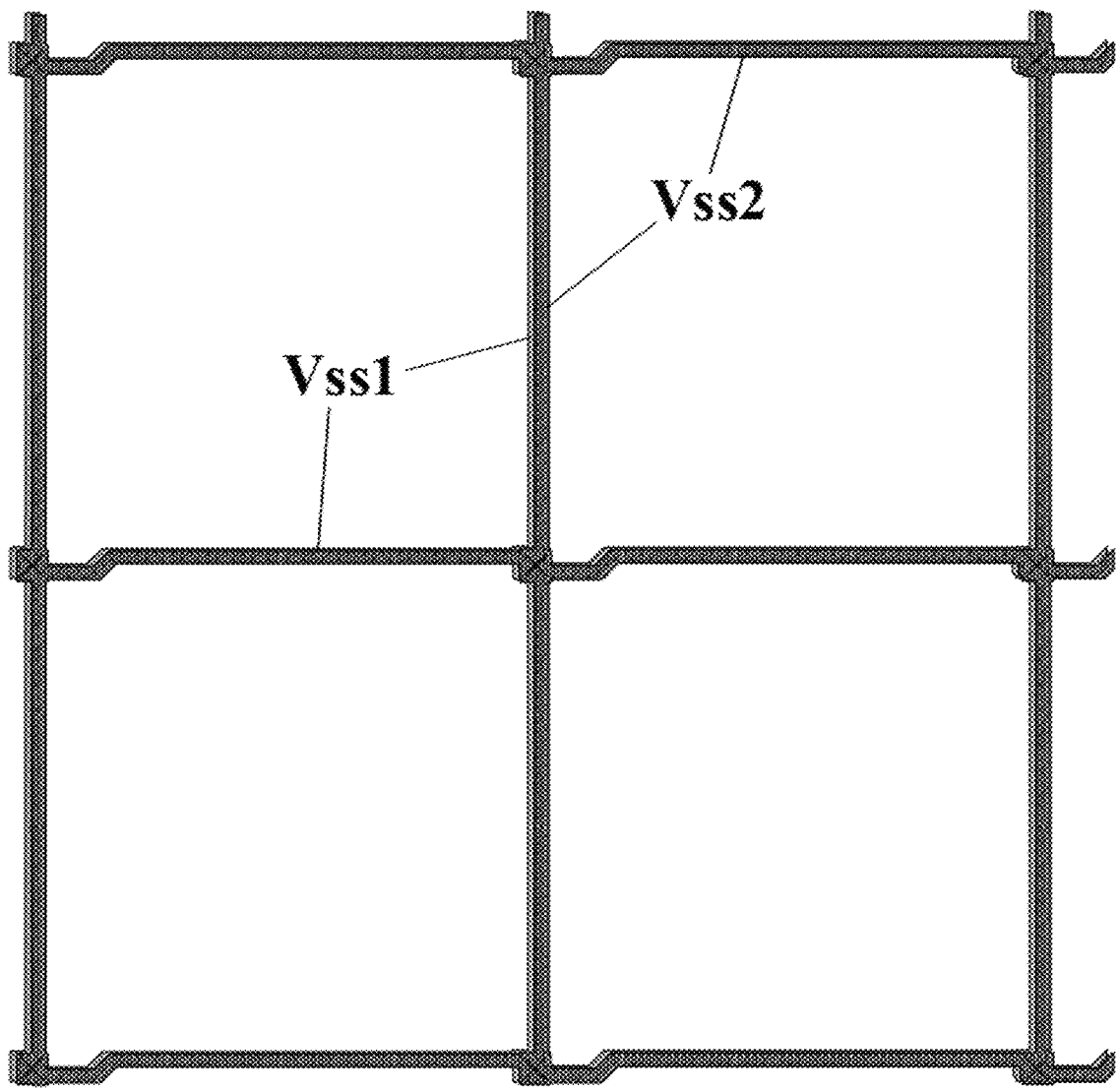
FIG. 11C is a diagram illustrating the structure of an interconnected low voltage supply network comprising a first sub-network and a second sub-network in some embodiments according to the present disclosure.

Various appropriate implementations of the interconnected low voltage supply network may be practiced according to the present disclosure. FIG. 11A is a diagram illustrating the stricture of a first sub-network of an interconnected low voltage supply network in some embodiments according to the present disclosure. FIG. 11B is a diagram illustrating the structure of a second sub-network of an interconnected low voltage supply network in some embodiments according to the present disclosure. FIG. 11C is a diagram illustrating the structure of an interconnected low voltage supply network comprising a first sub-network and a second sub-network in some embodiments according to the present disclosure. Referring to FIG. 11A to FIG. 11C, the interconnected low voltage supply network in some embodiments includes a first sub-network formed by the plurality of first low voltage signal lines Vss1 and a second sub-network formed by the plurality of second low voltage signal lines Vss2. Optionally, the first sub-network is in the first signal line layer and the second sub-network is in the second signal line layer. The plurality of first signal lines Vss1 are electrically connected to the plurality of second signal lines Vss2.

In some embodiments, the plurality of first low voltage signal lines Vss1 form a sub network whereas the plurality of second low voltage signal lines Vss2 do not form a sub network. In some embodiments, the plurality of second low voltage signal lines Vss2 form a sub-network whereas the plurality of first low voltage signal lines Vss1 do not form a sub network.

Figure 12A:
FIG. 12A is a diagram illustrating the structure of a plurality of first low voltage signal lines of an interconnected low voltage supply network in some embodiments according to the present disclosure.
Figure 12A:
Figure 12A:
Figure 12B:
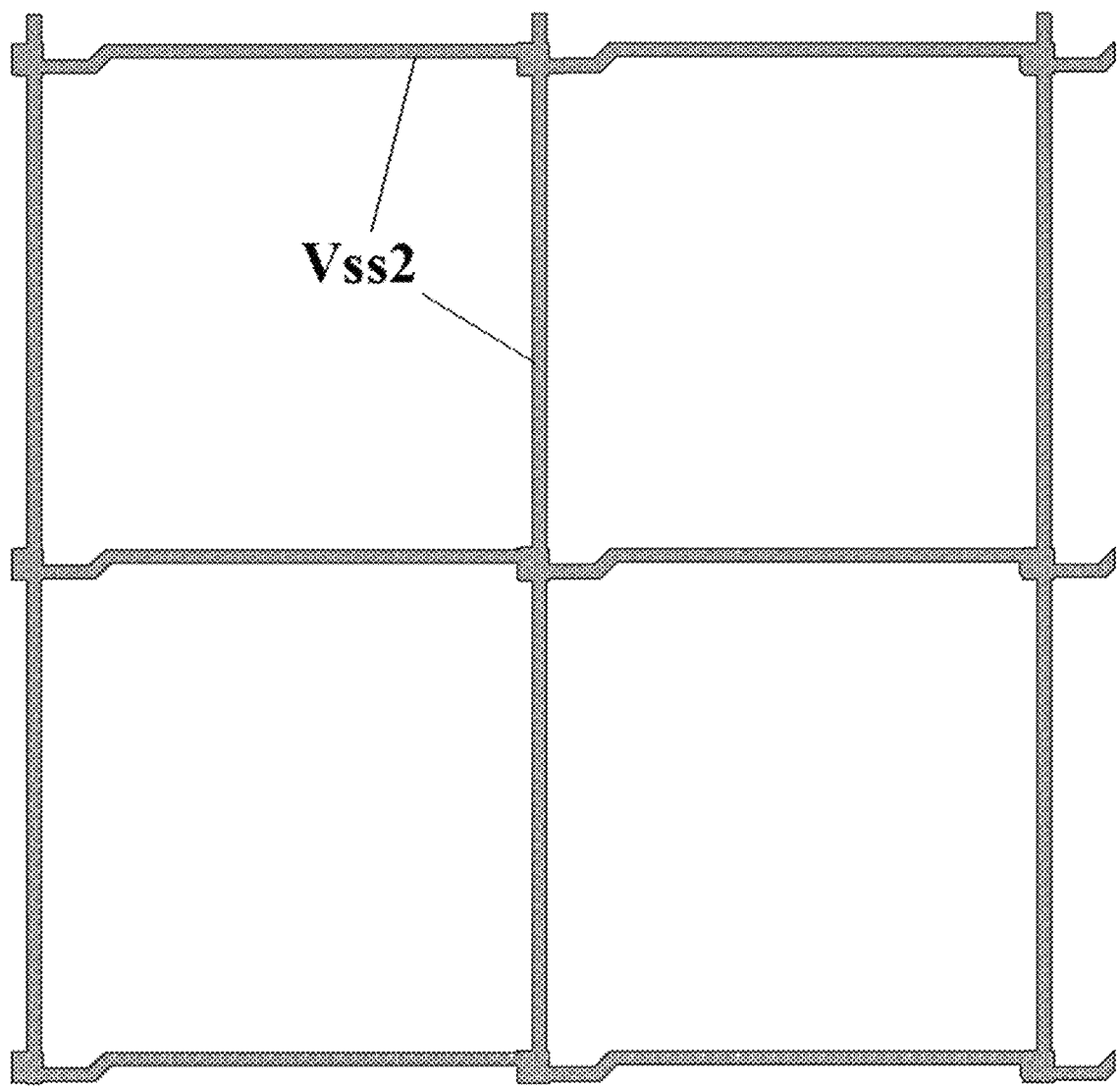
FIG. 12B is a diagram illustrating the structure of a sub-network of a plurality of second low voltage signal lines of an interconnected low voltage supply network in some embodiments according to the present disclosure.
Figure 12C:
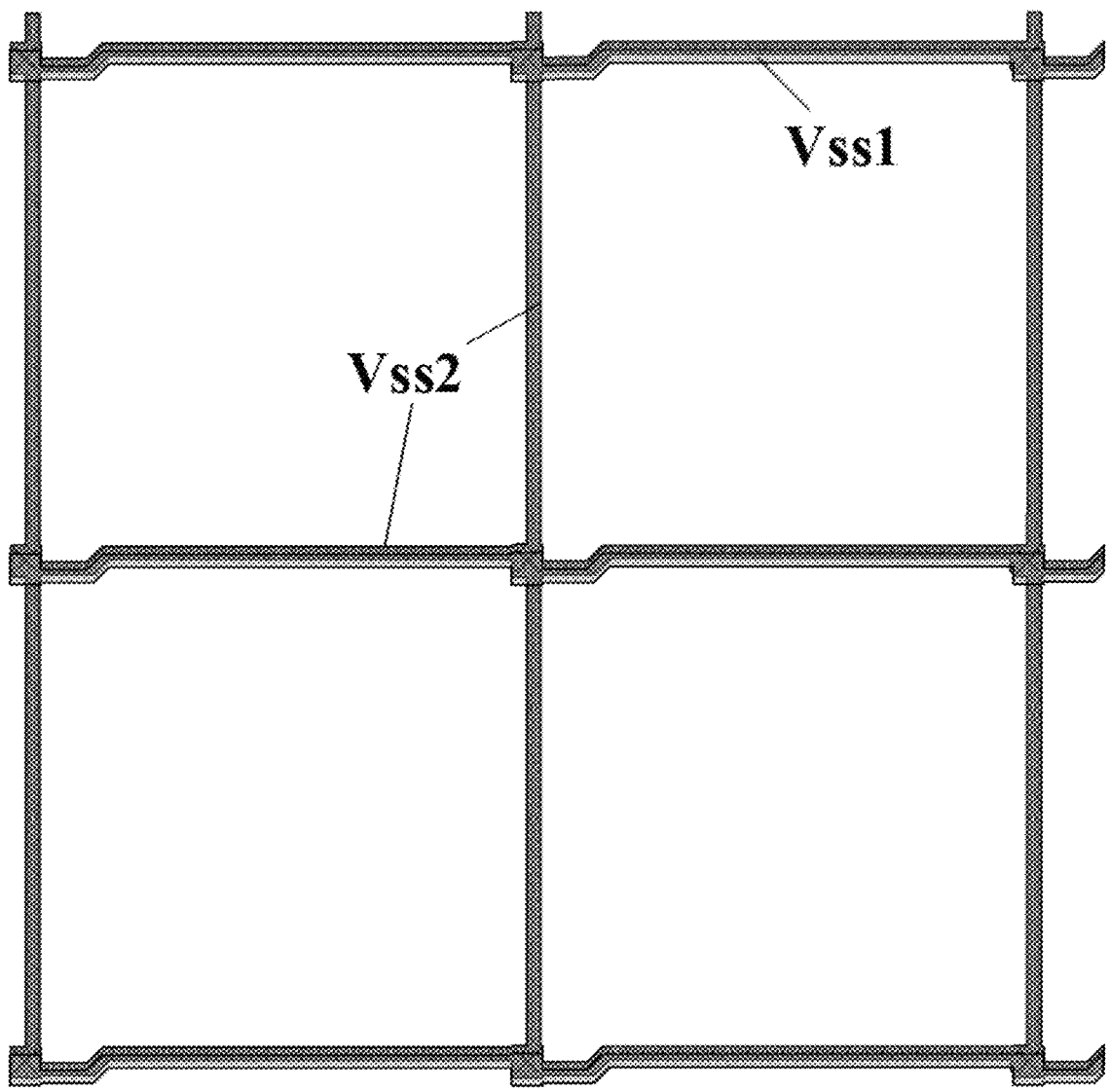
FIG. 12C is a diagram illustrating the structure of an interconnected low voltage supply network comprising a plurality of first low voltage signal lines and a sub-network of a plurality of second low voltage signal lines in some embodiments according to the present disclosure.

FIG. 12A is a diagram illustrating the structure of a plurality of first low voltage signal lines of an interconnected low voltage supply network in some embodiments according to the present disclosure. FIG. 12B is a diagram illustrating the structure of a sub-network of a plurality of second low voltage signal lines of an interconnected low voltage supply network in some embodiments according to the present disclosure. FIG. 12C is a diagram illustrating the structure of an interconnected low voltage supply network comprising a plurality of first low voltage signal lines and a sub-network of a plurality of second low voltage signal lines in some embodiments according to the present disclosure. Referring to FIG. 12A to FIG. 12C, the plurality of first low voltage signal lines Vss1 are separated from each other and does not form a sub-network, whereas the plurality of second low voltage signal lines Vss2 form a scar network. The plurality of first signal lines Vss1 are electrically connected to the plurality of second signal lines Vss2.

In another aspect, the present invention provides a display apparatus, including the display panel described herein or fabricated by a method described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a liquid crystal display apparatus.

In another aspect, the present disclosure provides a method of fabricating a display panel. In some embodiments, the method includes forming a plurality of light emitting elements; and forming an interconnected low voltage supply network configured to provide a low voltage signal to cathodes of the plurality of light emitting elements. Optionally, forming the interconnected low voltage supply network includes forming signal lines in a display area of the display panel.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claim appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising a plurality of subpixels, a respective subpixel comprising a respective light emitting element and a respective pixel driving circuit;
    wherein the display panel comprises:
    a plurality of light emitting elements; and
    an interconnected first voltage supply network configured to provide a first voltage signal to cathodes of the plurality of light emitting elements;
    wherein the interconnected first voltage supply network comprises signal lines in a display area of the display panel, the display area being at least partially surrounded by a peripheral area;
    the signal lines comprise a plurality of first signal lines in a first signal line layer and a plurality of second signal lines in a second signal line layer;
    the display panel further comprises a planarization layer between the first signal line layer and the second signal line layer; and
    the plurality of first signal lines are electrically connected to the plurality of second signal lines;
    wherein the plurality of first-first voltage signal lines and the plurality of second-first voltage signal lines interconnect through first vias respectively extending through the planarization layer, at least some of the first vias being in the display area;
    a respective one of the plurality of first-first voltage signal lines is connected to at least multiple ones of the plurality of second-first voltage signal lines respectively through multiple first vias extending through the planarization layer; and
    a respective one of the plurality of second-first voltage signal lines is connected to at least multiple ones of the plurality of first-first voltage signal lines respectively through multiple first vias extending through the planarization layer.

2. The display panel of claim 1, wherein the interconnected first voltage supply network comprises:
    a plurality of first-first voltage signal lines respectively along a first direction; and
    a plurality of second-first voltage signal lines respectively along a second direction;
    wherein the plurality of first-first voltage signal lines respectively cross over the plurality of second-first voltage signal lines.

3. The display panel of claim 2, wherein the interconnected first voltage supply network comprises a first sub-network formed by the plurality of first-first voltage signal lines and a second sub-network formed by the plurality of second-first voltage signal lines.

4. The display panel of claim 2, wherein a respective one of the plurality of first-first voltage signal lines is connected to at least multiple ones of the plurality of second-first voltage signal lines; and
    a respective one of the plurality of second-first voltage signal lines is connected to at least multiple ones of the plurality of first-first voltage signal lines.

5. The display panel of claim 1, further comprising a gate-on-array circuit in a peripheral area of the display panel;

wherein the interconnected first voltage supply network comprises a first peripheral first voltage line in the peripheral area on a first side of the display panel; and an orthographic projection of the first peripheral first voltage line on a base substrate at least partially overlaps with an orthographic projection of the gate-on-array circuit on the base substrate.

6. The display panel of claim 5, further comprising:
an anode metal layer on a side of the first peripheral first voltage line away from the gate-on-array circuit; and
a cathode layer on a side of the anode metal layer away from the first peripheral first voltage line;
wherein the cathode layer is connected to the anode metal layer through one or more first peripheral vias in the peripheral area and extending through a third planarization layer, the anode metal layer is connected to the first peripheral first voltage line through one or more second peripheral vias in the peripheral area and extending through a second planarization layer, thereby providing the first voltage signal to the cathodes of the plurality of light emitting elements;
the one or more first peripheral vias connecting the cathode layer and the anode metal layer, and the one or more second peripheral vias connecting the anode metal layer and the interconnected first voltage supply network are limited in the peripheral area, and absent in the display area; and
the first peripheral first voltage line and the anode metal layer connected to the first peripheral first voltage line respectively partially surround a display area.

7. The display panel of claim 1, further comprising an interconnected second voltage supply network configured to provide a second voltage signal to a plurality of pixel driving circuits;
wherein the interconnected second voltage supply network comprises:
a plurality of first-second voltage signal lines respectively along a first direction; and
a plurality of second-second voltage signal lines respectively along a second direction;
wherein the plurality of first-second voltage signal lines respectively cross over the plurality of second-second voltage signal lines.

8. The display panel of claim 7, wherein a respective one of the plurality of first-second voltage signal lines is connected to at least multiple ones of the plurality of second-second voltage signal lines; and
a respective one of the plurality of second-second voltage signal lines is connected to at least multiple ones of the plurality of first-second voltage signal lines.

9. The display panel of claim 1, comprising:
a base substrate;
a first signal line layer on the base substrate;
a planarization layer on a side of the first signal line layer away from the base substrate;
a second signal line layer on a side of the planarization layer away from the first signal line layer;
wherein the interconnected second voltage supply network comprises a plurality of first-second voltage signal lines respectively along a first direction and a plurality of second-second voltage signal lines respectively along a second direction;
wherein the first signal line layer comprises the plurality of first-second voltage signal lines, and the second signal line layer comprises the plurality of second-second voltage signal lines;

the plurality of first-second voltage signal lines and the plurality of second-second voltage signal lines interconnect through third vias respectively extending through the planarization layer;
a respective one of the plurality of first-second voltage signal lines is connected to at least multiple ones of the plurality of second-second voltage signal lines respectively through multiple third vias extending through the planarization layer; and
a respective one of the plurality of second-second voltage signal lines is connected to at least multiple ones of the plurality of first-second voltage signal lines respectively through multiple third vias extending through the planarization layer.

10. A display apparatus, comprising the display panel of claim 1, and one or more integrated circuits connected to the display panel.

11. A display panel, comprising:
a plurality of subpixels, a respective subpixel comprising a respective light emitting element and a respective pixel driving circuit;
an interconnected reset signal supply network configured to provide a reset signal to a plurality of pixel driving circuits;
a plurality of light emitting elements; and
an interconnected first voltage supply network configured to provide a first voltage signal to cathodes of the plurality of light emitting elements;
wherein the interconnected first voltage supply network comprises signal lines in a display area of the display panel, the display area being at least partially surrounded by a peripheral area;
the signal lines comprise a plurality of first signal lines in a first signal line layer and a plurality of second signal lines in a second signal line layer;
the display panel further comprises a planarization layer between the first signal line layer and the second signal line layer; and
the plurality of first signal lines are electrically connected to the plurality of second signal lines;
wherein the interconnected reset signal supply network comprises signal lines in a display area of the display panel.

12. The display panel of claim 11, wherein the interconnected reset signal supply network comprises:
a plurality of first reset signal lines respectively along a first direction; and
a plurality of second reset signal lines respectively along a second direction;
wherein the plurality of first reset signal lines respectively cross over the plurality of second reset signal lines.

13. The display panel of claim 12, wherein a respective one of the plurality of first reset signal lines is connected to at least multiple ones of the plurality of second reset signal lines; and
a respective one of the plurality of second reset signal lines is connected to at least multiple ones of the plurality of first reset signal lines.

14. The display panel of claim 12, wherein a minimal distance between a respective second reset signal line of the plurality of second reset signal lines and a respective second-first voltage signal line of the plurality of second-first voltage signal lines that is most adjacent to the respective second reset signal line is less than a minimal distance between the respective second reset signal line and a respective data line of a plurality of data line that is most adjacent to the respective second reset signal line.

15. The display panel of claim 12, wherein a total of three data lines and a total of one second-first voltage signal line are between two most adjacent second reset signal lines of the plurality of second reset signal lines.

16. A display panel, comprising:
a base substrate;
a plurality of subpixels, a respective subpixel comprising a respective light emitting element and a respective pixel driving circuit;
a plurality of light emitting elements;
an interconnected first voltage supply network configured to provide a first voltage signal to cathodes of the plurality of light emitting elements;
a semiconductor material layer on the base substrate;
a planarization layer on a side of the semiconductor material layer away from the base substrate;
a second signal line layer on a side of the planarization layer away from the semiconductor material layer;
wherein the interconnected first voltage supply network comprises signal lines in a display area of the display panel, the display area being at least partially surrounded by a peripheral area;
the signal lines comprise a plurality of first signal lines in a first signal line layer and a plurality of second signal lines in a second signal line layer;
the display panel further comprises a planarization layer between the first signal line layer and the second signal line layer; and
the plurality of first signal lines are electrically connected to the plurality of second signal lines;
wherein the display panel further comprises an interconnected reset signal supply network configured to provide a reset signal to a plurality of pixel driving circuits;
the interconnected reset signal supply network comprises a plurality of first reset signal lines respectively along a first direction and a plurality of second reset signal lines respectively along a second direction; and
the semiconductor material layer comprises the plurality of first reset signal lines, and the second signal line layer comprises the plurality of second reset signal lines.

17. The display panel of claim 16, wherein the plurality of first reset signal lines and the plurality of second reset signal lines interconnect through second vias respectively extending through at least the planarization layer;
wherein the display panel further comprises:
a gate insulating layer on a side of the semiconductor material layer away from the base substrate;
an insulating layer on a side of the gate insulating layer away from the semiconductor material layer; and
an inter-layer dielectric layer a side of the insulating layer away from the gate insulating layer;
wherein the planarization layer is on a side of the inter-layer dielectric layer away from the insulating layer; and
the plurality of first reset signal lines and the plurality of second reset signal lines interconnect through second vias, a respective second via extending through the planarization layer, the inter-layer dielectric layer, the insulating layer, and the gate insulating layer.

18. The display panel of claim 16, wherein a respective one of the plurality of first reset signal lines is connected to at least multiple ones of the plurality of second reset signal lines respectively through multiple second vias extending through at least the planarization layer; and
a respective one of the plurality of second reset signal lines is connected to at least multiple ones of the plurality of first reset signal lines respectively through multiple second vias extending through at least the planarization layer.

19. The display panel of claim 16, wherein the plurality of first reset signal lines comprise a semiconductor material;
the plurality of second reset signal lines comprise a metallic material; and
the plurality of first reset signal lines and at least active layers of a plurality of thin film transistors are in the semiconductor material layer, and comprise a same semiconductor material.

* * * * *